United States Patent
Kobayashi et al.

(10) Patent No.: US 11,754,609 B2
(45) Date of Patent: Sep. 12, 2023

(54) TEMPERATURE TEST APPARATUS AND TEMPERATURE TEST METHOD

(71) Applicant: ANRITSU CORPORATION, Kanagawa (JP)

(72) Inventors: Takeshi Kobayashi, Kanagawa (JP); Tomohiko Maruo, Kanagawa (JP); Yasuhiko Nago, Kanagawa (JP); Marco Angelo Del Pilar Samonte, Kanagawa (JP)

(73) Assignee: ANRITSU CORPORATION, Kanagawa (JP)

(*) Notice: Subject to any disclaimer, the term of this patent is extended or adjusted under 35 U.S.C. 154(b) by 436 days.

(21) Appl. No.: 17/189,670

(22) Filed: Mar. 2, 2021

(65) Prior Publication Data

US 2021/0293869 A1    Sep. 23, 2021

(30) Foreign Application Priority Data

Mar. 19, 2020 (JP) .................... 2020-049302

(51) Int. Cl.
*G01R 29/10* (2006.01)
*G01R 31/28* (2006.01)
(Continued)

(52) U.S. Cl.
CPC ....... *G01R 29/105* (2013.01); *G01R 29/0864* (2013.01); *G01R 31/003* (2013.01); *G01R 31/2874* (2013.01)

(58) Field of Classification Search
CPC ............. G01R 29/105; G01R 29/0864; G01R 31/003; G01R 31/2874; G01R 29/0878;
(Continued)

(56) References Cited

U.S. PATENT DOCUMENTS

| 10,969,427 B2 * | 4/2021 | Rowell ............. G01R 31/3025 |
| 2020/0025822 A1 * | 1/2020 | Rowell ............. G01R 29/0821 |
| 2020/0177289 A1 | 6/2020 | Maruo et al. |

FOREIGN PATENT DOCUMENTS

| JP | 4718437 B2 | 7/2011 |
| JP | 2020-085784 A | 6/2020 |

OTHER PUBLICATIONS

3GPP TR 38.810 v16.2.0 (Mar. 2019); Technical Report, 3rd Generation Partnership Project; Technical Specification Group Radio Access Network; NR; Study on Test Methods; (Release 16). Cited in the Specification.

* cited by examiner

*Primary Examiner* — Renan Luque
(74) *Attorney, Agent, or Firm* — Pearne & Gordon LLP

(57) ABSTRACT

The temperature test apparatus includes a test antenna for measuring transmission and reception characteristics of a DUT, an anechoic box formed by a metal housing having an internal space, a heat insulating housing, a temperature control device that controls the temperature of a spatial region, and a measurement device that measures the transmission and reception characteristics of the DUT. The temperature control device and the heat insulating housing are connected to each other by a pipe 31 through which a gas for controlling the temperature of the spatial region passes and that goes through the metal housing. A portion 31A of the pipe from the metal housing to a predetermined position of the internal space is made of metal. A metal net portion 33 that blocks a pipeline 31Ae of a portion of the pipe 31 is provided.

8 Claims, 17 Drawing Sheets

(51) Int. Cl.
*G01R 31/00* (2006.01)
*G01R 29/08* (2006.01)

(58) Field of Classification Search
CPC ............ G01R 29/0821; G01R 31/3025; G01R 31/311; G01R 29/0871; G01R 1/04; G01R 31/2822; G01R 31/303; G01R 31/31903; G01R 31/2813; H01Q 15/14; H01Q 15/16; H01Q 3/16; H01Q 19/132; H01L 2924/0002; H01L 2924/00; H01L 2224/48227; H01L 2224/73265; H04B 17/354; H04B 17/102; H04B 17/0087; H04B 17/391; H04B 17/101

See application file for complete search history.

TEMPERATURE TEST APPARATUS AND TEMPERATURE TEST METHOD

TECHNICAL FIELD

The present invention relates to a temperature test apparatus and a temperature test method for measuring temperature dependency of transmission characteristics or reception characteristics of a device under test by using an anechoic box in an OTA (Over The Air) environment.

BACKGROUND ART

In recent years, with the development of multimedia, radio terminals (smartphones and the like) equipped with antennas for radio communication such as cellular and wireless LAN have been actively produced. In the future, in particular, there is a demand for radio terminals that transmit and receive radio signals compatible with IEEE 802.11ad, 5G cellular, and the like, which use wideband signals in the millimeter wave band.

In a design and development company or manufacturing plant of a radio terminal, a performance test as follows is performed on a radio communication antenna of the radio terminal: an output level of a transmission radio wave defined for each communication standard or reception sensitivity is measured, and it is determined whether or not to satisfy a predetermined criterion.

With the transition of generations from 4G or 4G advanced to 5G, a test method of the above-described performance test also changes. For example, in a performance test in which a radio terminal (referred to as a 5G radio terminal below) for a 5G New Radio (NR) system is set as a device under test (DUT), it is not possible to use a method of connecting an antenna terminal of the DUT and a test apparatus in a wired manner, which is the mainstream in tests for 4G, 4G advanced, or the like. The reason is that characteristics are deteriorated by attaching the antenna terminal to a high frequency circuit, or it is not realistic to attach the antenna terminal to all elements in consideration of a space and cost because the number of elements in an array antenna is large. Therefore, a so-called OTA test is performed (for example, see Patent Documents 1 and 2). In the OTA test, a DUT with a test antenna is accommodated in an anechoic box that is not influenced by the surrounding radio wave environment, transmission of a test signal from the test antenna to the DUT and reception of a measurement target signal from the DUT that receives the test signal by the test antenna are performed by radio communication.

As the OTA test environment, a temperature test in which the temperature around a DUT is changed to a high temperature (for example, 55° C.) and a low temperature (for example, −10° C.) is required in addition to a test at room temperature. At that time, in order to maintain the temperature around the DUT, a heat insulating housing made of a heat insulating material is attached around the DUT. A structure of a heat insulating housing for reducing deterioration (that is, deterioration of the quality of a quiet zone) of a measurement result by the heat insulating housing is desired. Here, the quiet zone has a concept representing a range of a spatial region in which a radio signal of the DUT is emitted from the test antenna with a substantially uniform amplitude and phase in the anechoic box forming the OTA test environment (for example, see Non Patent Document 1). The shape of the quiet zone is usually spherical. It is possible to perform the OTA test in a state where an influence of scattered waves from the surroundings is suppressed, by disposing the DUT in such a quiet zone. In addition, in the temperature test, temperature-controlled air is sent to the heat insulating housing to control the temperature in the heat insulating housing.

RELATED ART DOCUMENT

Patent Document

[Patent Document 1] Japanese Patent Application No. 2018-223942
[Patent Document 2] Japanese Patent No. 4718437

Non Patent Document

[Non Patent Document 1] 3GPP TR 38.810 V16.2.0 (2019-03)

DISCLOSURE OF THE INVENTION

Problem that the Invention is to Solve

An environmental test apparatus disclosed in Patent Document 2 includes a housing having an air-conditioning room in which a temperature and humidity adjusting unit is accommodated, and a cover forming a test room in which a device under test, which is adjacent to the air-conditioning room is accommodated. The housing has a structure in which a through-hole is formed in a metal partition wall for separating the air-conditioning room and the test room, and the through-hole is covered with a metal mesh.

However, in the environmental test apparatus disclosed in Patent Document 2, the partition wall at the bottom of the test room is shared with the air-conditioning room made of a metal housing, and the temperature of the entirety of the housing including the air-conditioning room is changed. A temperature test apparatus, in which only the inside of a heat insulating box installed in the anechoic box is temperature-controlled with high efficiency by using a temperature control device installed on the outside of a relatively large anechoic box for the OTA test, that enables measurement of the temperature dependency of the transmission characteristics or reception characteristics of the device under test, has a problem in obtaining sufficient electromagnetic shield characteristics.

The present invention has been made to solve such a problem in the related art, and an object of the present invention is to provide a temperature test apparatus and a temperature test method capable of preventing leakage of a radio wave from an anechoic box and intrusion of an unnecessary radio wave from the outside to the anechoic box while securing the sufficient heat insulating effect, when the temperature dependency of transmission characteristics or reception characteristics of a device under test is measured in an OTA test environment.

Means for Solving the Problem

In order to solve the above problems, according to the present invention, a temperature test apparatus 1 measures temperature dependency of transmission characteristics or reception characteristics of a device 100 under test including an antenna 110 under test. The apparatus includes an anechoic box 50 that has an internal space 51 that is not influenced by a surrounding radio wave environment and is formed by a metal housing, a test antenna 6 that is accommodated in the internal space and is configured to transmit or receive a radio signal to and from the antenna under test, a heat insulating housing 70 that is accommodated in the internal space and is made of a heat insulating material to surround a spatial region 71 including a quiet zone in which the device under test is disposed, a temperature control device 30 that is disposed outside the anechoic box and controls a temperature of the spatial region, a pipe 31 through which a gas for controlling the temperature of the spatial region passes and that connects the temperature control device and the heat insulating housing to each other through the metal housing of the anechoic box, and a measurement device 2 that uses the test antenna in a state where the temperature of the spatial region is controlled by the temperature control device, to measure the transmission characteristics or the reception characteristics of the device under test. A portion 31A of the pipe from the metal housing to a predetermined position of the internal space is made of metal, and the portion of the pipe further includes an electromagnetic shield structure. In the temperature test apparatus according to the present invention, the electromagnetic shield structure may be a metal net portion 33 inserted into a pipeline 31Ae of a portion of the pipe.

As described above, the temperature control device and the heat insulating housing are connected by the metal pipe through which a gas for controlling the temperature of the spatial region in the heat insulating housing passes. A metal net portion that blocks a pipeline of the pipe is provided. With this configuration, the pipeline of the metal pipe is electromagnetically shielded by the metal net portion. It is not possible for the radio wave in the anechoic box to go out through the pipe, and it is not possible for an external unnecessary radio wave to enter the anechoic box through the pipe. Therefore, in the temperature test apparatus according to the present invention, it is possible to prevent leakage of a radio wave from the anechoic box through the pipe and entering of an external unnecessary radio wave into the anechoic box through the pipe, while the gas for controlling the temperature is sent into the heat insulating housing through the pipe and is sent out from the heat insulating housing.

In the temperature test apparatus according to the present invention, the net portion may be disposed to cover an opening portion 31A at an end portion of the portion 31A of the pipe on the heat insulating housing side.

With this configuration, the temperature test apparatus according to the present invention can easily attach the net portion to the pipe and can reliably perform electromagnetic shielding.

In the temperature test apparatus according to the present invention, the net portion may be disposed at an intermediate portion 31Ad of the pipeline 31Ae of the portion 31A of the pipe.

With this configuration, the temperature test apparatus according to the present invention does not need to have an electromagnetic shield structure in the heat insulating housing, and thus realize space saving.

In the temperature test apparatus according to the present invention, a curved portion 31Ab obtained by bending the pipeline 31Ae of the portion 31A of the pipe may be provided at the portion 31A of the pipe.

With this configuration, in the temperature test apparatus according to the present invention, traveling of a radio wave that has strong straightness and has a short wavelength is blocked at the curved portion. The radio wave is leaked to the outside less frequently, and intrusion from the outside occurs less frequently.

In the temperature test apparatus according to the present invention, a diameter-enlarged portion 31Ac in which a diameter at a location in which the net portion is provided is enlarged may be provided at the portion 31A of the pipe.

With this configuration, in the temperature test apparatus according to the present invention, the resistance against a gas flow increases by the metal net portion, but the gas flow becomes easier due to the diameter-enlarged portion. Thus, it is possible to prevent a decrease of a gas flow rate as a whole.

In addition, according to the present invention, the temperature test apparatus 1 measures temperature dependency of transmission characteristics or reception characteristics of a device 100 under test having an antenna 110 under test. The temperature test apparatus includes an anechoic box 50 including an internal space 51 that is not influenced by a surrounding radio wave environment, a test antenna 6 that is accommodated in the internal space and is configured to transmit or receive a radio signal to and from the antenna under test, a heat insulating housing 70 that is accommodated in the internal space and is made of a heat insulating material to surround a spatial region 71 including a quiet zone in which the device under test is disposed, a temperature control device 30 that controls the temperature of the spatial region, and a measurement device 2 that measures the transmission characteristics or the reception characteristics of the device under test by using the test antenna in a state where the temperature of the spatial region is controlled by the temperature control device. The temperature control device and the heat insulating housing are connected to each other by a pipe (31, 32) through which a gas for controlling the temperature of the spatial region passes and that goes through the metal housing. A portion 31A of the pipe from the metal housing to a predetermined position of the internal space is made of metal. A curved portion 31Ab obtained by bending a pipeline 31Ae of a portion of the pipe is provided.

With this configuration, in the temperature test apparatus according to the present invention, traveling of a radio wave that has strong straightness and has a short wavelength is blocked at the curved portion. The radio wave is leaked to the outside less frequently, and intrusion from the outside occurs less frequently.

According to the present invention, there is provided a temperature test method using the temperature test apparatus described in any aspect. The method includes a temperature control step S2 of controlling a temperature of a spatial region to a plurality of predetermined temperatures, a posture changeable step S4 of sequentially changing a posture of a device under test disposed in a quiet zone, and a measurement step S7 of measuring transmission characteristics or reception characteristics of the device under test by changing the posture of the device under test in the posture changeable step, in a state where the temperature of the spatial region is controlled by the temperature control step.

As described above, in the temperature test apparatus used in the temperature test method according to the present invention, the temperature control device and the heat insulating housing are connected to each other by a metal pipe through which a gas for controlling the temperature of the spatial region in the heat insulating housing passes. A metal net portion that blocks a pipeline of the pipe is provided at the pipe. In addition, a curved portion obtained by bending the pipeline of the pipe is provided. With this configuration, the pipeline of the metal pipe is electromagnetically shielded. It is not possible for the radio wave in the anechoic box to go out through the pipe, and it is not possible for an external unnecessary radio wave to enter the anechoic box through the pipe. Therefore, in the temperature test method according to the present invention, it is possible to prevent leakage of a radio wave from the anechoic box through the pipe and entering of an external radio wave into the anechoic box through the pipe, while the gas for controlling the temperature is sent into the heat insulating housing through the pipe and is sent out from the heat insulating housing.

Advantage of the Invention

According to the present invention, in the temperature test apparatus in which only the inside of a heat insulating box installed in the anechoic box is temperature-controlled with high efficiency by using a temperature control device installed on the outside of a relatively large anechoic box for the OTA test, that enables measurement of the temperature dependency of the transmission characteristics or reception characteristics of the device under test, it is possible to provide the temperature test apparatus and the temperature test method capable of preventing leakage of a radio wave from the anechoic box and intrusion of an unnecessary radio wave from the outside into the anechoic box.

BRIEF DESCRIPTION OF THE DRAWINGS

FIG. 9A is a cross-sectional view and FIG. 9B is a diagram viewed from a direction of an A arrow in FIG. 9A.

FIG. 11A is a cross-sectional view and FIG. 11B is a diagram viewed from a direction of a B arrow in FIG. 11A.

BEST MODE FOR CARRYING OUT THE INVENTION

Figure 1:
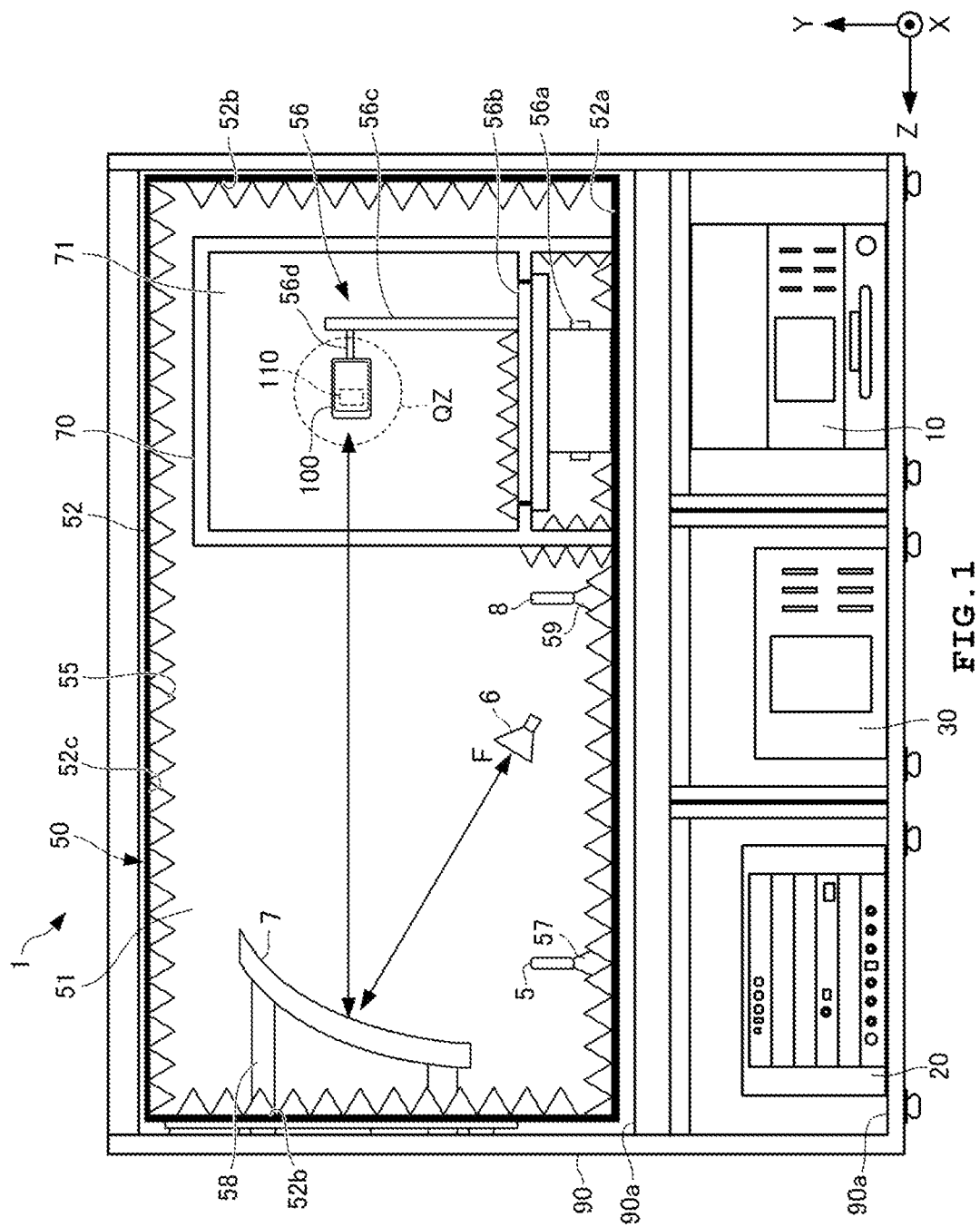
FIG. 1 is a diagram illustrating a schematic configuration of an entirety of a temperature test apparatus according to an embodiment of the present invention.

Hereinafter, a temperature test apparatus and a temperature test method according to an embodiment of the present invention will be described with reference to the drawings. The dimensional ratio of each component in each drawing is not necessarily equal to the actual dimensional ratio.

A temperature test apparatus 1 according to the embodiment measures the temperature dependency of transmission characteristics or reception characteristics of a DUT 100 including an antenna 110. Therefore, the temperature test apparatus 1 includes an OTA chamber 50, a test antenna 6, a posture changeable mechanism 56, a heat insulating housing 70, a temperature control device 30, and a measurement device 2. In the embodiment, the OTA chamber 50 corresponds to an anechoic box of the present invention.

Figure 2:
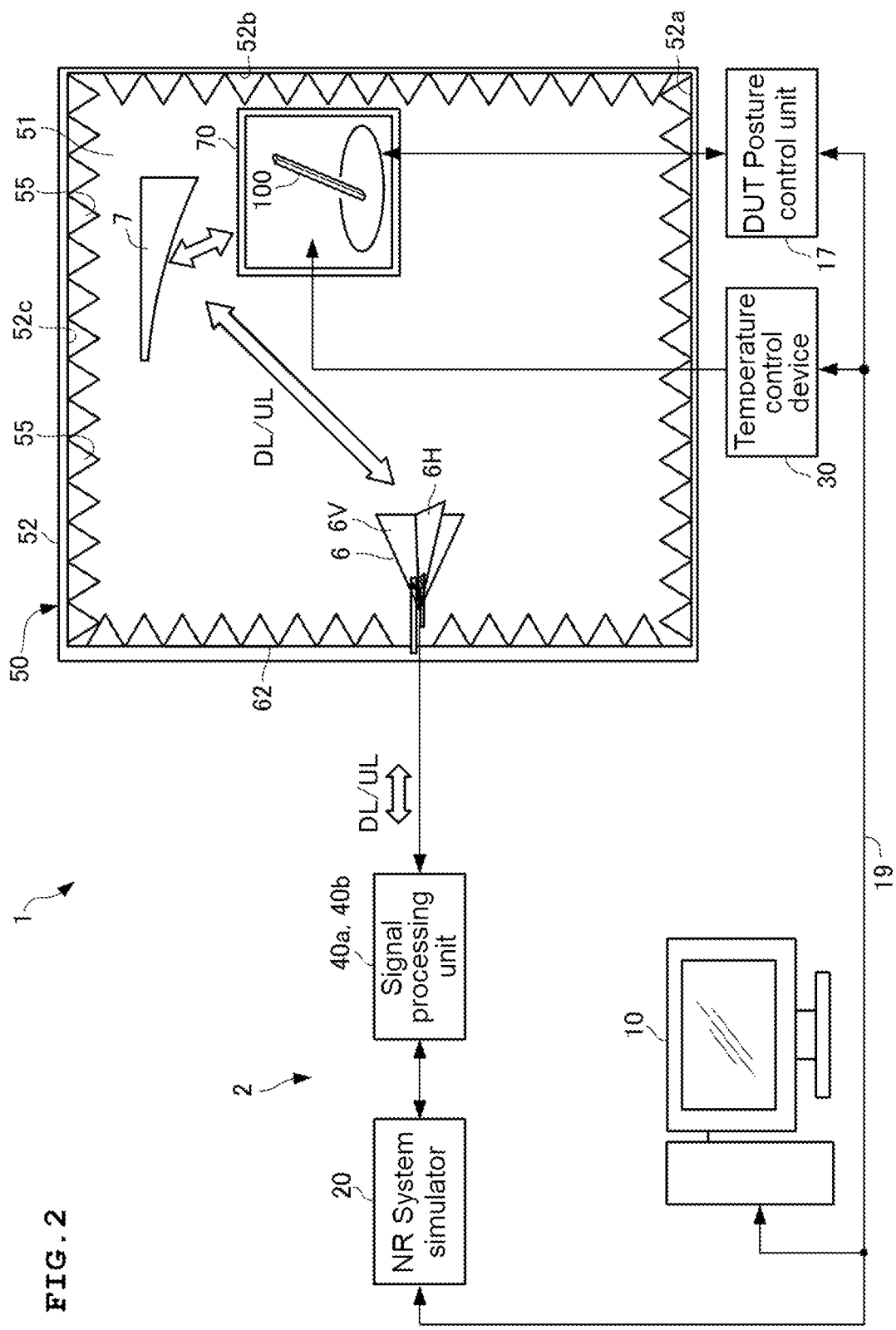
FIG. 2 is a block diagram illustrating a functional configuration of the temperature test apparatus according to the embodiment of the present invention.

FIG. 1 illustrates an external structure of the temperature test apparatus 1. FIG. 2 illustrates a functional block of the temperature test apparatus 1. FIG. 1 illustrates an arrangement form of components in a state where the OTA chamber 50 is seen through from the front.

As illustrated in FIGS. 1 and 2, the OTA chamber 50 has an internal space 51 that is not influenced by the surrounding radio wave environment. The test antenna 6 is accommodated in the internal space 51 of the OTA chamber 50, and transmits or receives a radio signal for measuring the transmission characteristics or the reception characteristics of the DUT 100, to and from the antenna 110. The posture changeable mechanism 56 sequentially changes the posture of the DUT 100 disposed in a quiet zone QZ in the internal space 51 of the OTA chamber 50. The heat insulating housing 70 is accommodated in the internal space 51 of the OTA chamber 50, and is made of a heat insulating material to surround a spatial region 71 including the quiet zone QZ. The temperature control device 30 is capable of controlling the temperature of the spatial region 71 to a plurality of predetermined temperatures. The measurement device 2 includes an integrated control device 10, an NR system simulator 20, and signal processing units 40a and 40b. The measurement device measures the transmission characteristics or the reception characteristics of the DUT 100 each time the posture of the DUT 100 is changed by the posture changeable mechanism 56 in a state where the temperature of the spatial region 71 is controlled by the temperature control device 30.

The temperature test apparatus 1 is used, for example, together with a rack structure body 90 including a plurality of racks 90a as illustrated in FIG. 1, and is operated in a state where each component is placed on each rack 90a. FIG. 1 illustrates an example in which the integrated control device 10, the NR system simulator 20, the temperature control device 30, and the OTA chamber 50 are mounted on each rack 90a of the rack structure body 90. The components will be described below.

OTA Chamber

The OTA chamber 50 realizes an OTA test environment for a performance test of a 5G radio terminal. As illustrated in FIGS. 1 and 2, the OTA chamber is configured by, for example, a metal housing body 52 having a rectangular parallelepiped internal space 51. The OTA chamber 50 accommodates the DUT 100 and the test antenna 6 facing the antenna 110 of the DUT 100 in the internal space 51 in a state of preventing the intrusion of a radio wave from the outside and the radiation of radio waves to the outside. As will be described later, as the test antenna 6, for example, an antenna for millimeter waves, that has directivity, such as a horn antenna can be used.

A reflector 7 and a heat insulating housing 70 are accommodated in the internal space 51 of the OTA chamber 50. The reflector reflects the radio signal radiated from the test antenna 6 toward the antenna 110 of the DUT 100. The heat insulating housing is made of a heat insulating material to surround the spatial region 71 including the quiet zone QZ. A radio wave absorber 55 is attached to the entirety of the inner surface of the OTA chamber 50, that is, the entire surface of the bottom surface 52a, the side surface 52b, and the top surface 52c of the housing body 52 to secure anechoic characteristics of the internal space. Thus, a radiation regulation function of a radio wave to the outside is reinforced. As described above, the OTA chamber 50 realizes the anechoic box having the internal space 51 that is not influenced by the surrounding radio wave environment. The anechoic box used in the embodiment is, for example, an anechoic type.

DUT

The DUT 100 as a device under test is, for example, a radio terminal such as a smartphone. Communication standards for the DUT 100 includes cellular (LTE, LTE-A, W-CDMA (registered trademark), GSM (registered trademark), CDMA 2000, 1×EV-DO, TD-SCDMA, and the like), wireless LAN (IEEE 802.11b/g/a/n/ac/ad, and the like), Bluetooth (registered trademark), GNSS (GPS, Galileo, CDMA, BeiDou, and the like), FM, and digital broadcasting (DVB-H, ISDB-T, and the like). The DUT 100 may be a radio terminal that transmits and receives a radio signal of a millimeter wave band corresponding to 5G cellular or the like.

In the embodiment, the DUT 100 is a 5G NR radio terminal. For the 5G NR radio terminal, it is defined by the 5G NR standard, that a predetermined frequency band including a millimeter wave band and other frequency bands used in LTE and the like is set as a communicable frequency range. In short, the antenna 110 of the DUT 100 transmits or receives a radio signal of a predetermined frequency band (5G NR band), which is a measurement target for the transmission characteristics or the reception characteristics of the DUT 100. The antenna 110 is, for example, an array antenna such as a Massive-MIMO antenna, and corresponds to an antenna under test in the invention.

In the embodiment, the DUT 100 can transmit and receive a test signal and a measurement target signal via the test antenna 6 during measurement related to transmission and reception in the OTA chamber 50.

Posture Changeable Mechanism

Next, the posture changeable mechanism 56 provided in the internal space 51 of the OTA chamber 50 will be described. As illustrated in FIG. 1, the posture changeable mechanism 56 is provided on the bottom surface 52a of the housing body 52 of the OTA chamber 50 on the internal space 51 side. The posture changeable mechanism sequentially changes the posture of the DUT 100 disposed in the quiet zone QZ. The posture changeable mechanism 56 is, for example, a biaxial positioner including a rotating mechanism that rotates around each of two axes. The posture changeable mechanism 56 forms an OTA test system (Combined-axes system) in which the DUT 100 is rotated with a degree of freedom of rotation around two axes in a state where the test antenna 6 is fixed. Specifically, the posture changeable mechanism 56 includes a drive unit 56a, a turntable 56b, a fulcrum 56c, and a DUT mounting portion 56d as a device-under-test mounting portion.

The drive unit 56a is configured by a drive motor such as a stepping motor that generates a rotational driving force. The drive unit is installed on, for example, the bottom surface 52a. The turntable 56b rotates by a predetermined angle around one of the two axes perpendicular to each other by the rotational driving force of the drive unit 56a. The fulcrum 56c is joined to the turntable 56b. The fulcrum extends from the turntable 56b in a direction of one axis, and rotates together with the turntable 56b by the rotational driving force of the drive unit 56a. The DUT mounting portion 56d extends from the side surface of the fulcrum 56c in a direction of the other axis of the two axes, and rotates by a predetermined angle around the other axis by the rotational driving force of the drive unit 56a. The DUT 100 is mounted on the DUT mounting portion 56d.

The above-described one axis is, for example, an axis (Y axis in FIG. 1) extending in a vertical direction to the bottom surface 52a the drawing). The other axis is, for example, an axis extending in a horizontal direction from the side surface of the fulcrum 56c. The posture changeable mechanism 56 configured as described above can rotate the DUT 100 held on the DUT mounting portion 56d, so as to enable the sequential change of the posture of the DUT in a state where the antenna 110 is directed toward the test antenna 6 and the reflector 7 in all three-dimensional directions. For example, the center of the DUT 100 is set as the rotation center.

Link Antenna

In the OTA chamber 50, two types of link antennas 5 and 8 are attached to the required positions of the housing body 52 by holders 57 and 59, respectively. The link antennas are provided in order to establish or maintain a link (call) with the DUT 100. The link antenna is a link antenna for LTE, and is used in a non-standalone mode. The link antenna 8 is a link antenna for 5G and is used to maintain a 5G call. The link antennas 5 and 8 are held by the holders 57 and 59, respectively, so as to have directivity with respect to the DUT 100 held by the posture changeable mechanism 56. Since it is possible to use the test antenna 6 as the link antenna instead of using the above link antennas 5 and 8, description will be made below on the assumption that the test antenna 6 also has a function of the link antenna.

Near Field and Far Field

Figure 5A:
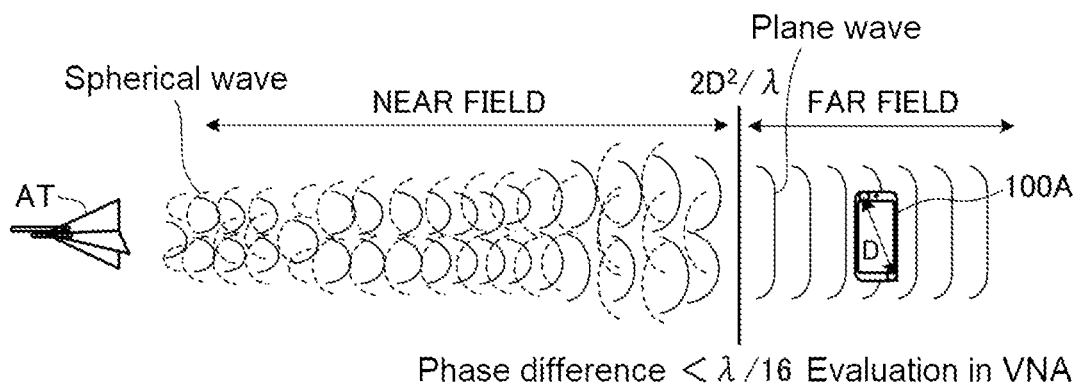
FIGS. 5A and 5B are schematic diagrams illustrating a near field and a far field in radio wave propagation between an antenna and a radio terminal.
Figure 5B:
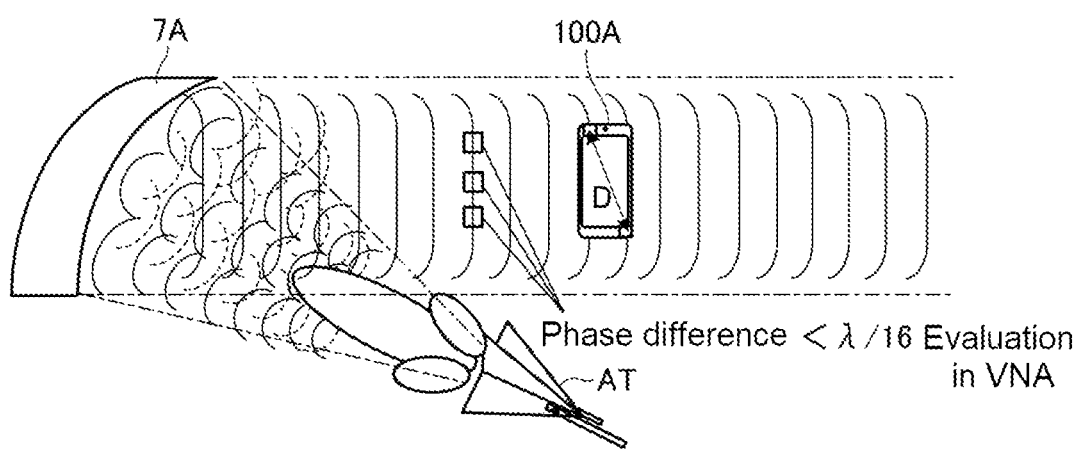

Next, the near field and the far field will be described. FIG. 5 is a schematic diagram illustrating how radio waves radiated from an antenna AT toward a radio terminal 100A are transmitted. The antenna AT is equivalent to the test antenna 6 as a primary radiator, which will be described later. The radio terminal 100A is equivalent to the DUT 100. In FIG. 5, FIG. 5A illustrates a DFF (Direct Far Field) method in which a radio wave is directly transmitted from the antenna AT to the radio terminal 100A, and FIG. 5B illustrates an IFF (Indirect Far Field) method in which a radio wave is transmitted from the antenna AT to the radio terminal 100A through a reflecting mirror 7A having a rotating paraboloid.

As illustrated in FIG. 5A, a radio wave having a radiation source being the antenna AT has a property of propagating while a surface (wave surface) joining points having the same phase spreads spherically around the radiation source. At this time, interference waves generated by disturbances such as scattering, refraction, and reflection as indicated by broken lines are also generated. The wave surface is a curved spherical surface (spherical wave) at a distance close to the radiation source, but the wave surface becomes close to a plane (plane wave) at a distance far from the radiation source. In general, a region where the wave surface is required to be considered as a spherical surface is referred to as a near field, and a region where the wave surface may not be considered as a plane is referred to as a far field. In the propagation of radio waves illustrated in FIG. 5A, it is preferable that the radio terminal 100A receives a plane wave rather than a spherical wave in order to perform accurate measurement.

In order to receive a plane wave, the radio terminal 100A needs to be installed in a far field. When the position and antenna size of the antenna 110 in the DUT 100 are not known, the far field is a region beyond $2D^2/\lambda$ from the antenna AT. Here, D indicates the maximum linear size of the radio terminal 100A, and $\lambda$ indicates the wavelength of the radio wave.

Specifically, for example, when, in the radio terminal 100A, the maximum linear size D is set to 0.4 m and the wavelength $\lambda$ is set to 0.01 m (corresponding to a radio signal in the 28 GHz band), the position of about 30 m from the antenna AT is set as a boundary between the near field and the far field. It is required to place the radio terminal 100A at a position farther than the boundary distance. In the embodiment, it is assumed that a DUT 100 in which the maximum linear size D is, for example, about 5 cm (centimeter) to 33 cm is measured.

FIG. 5B illustrates a method (CATR (Compact Antenna Test Range) method) of disposing the reflecting mirror 7A having a rotating paraboloid so that a radio wave of the antenna AT is reflected, and then the reflected wave reaches the position of the radio terminal 100A. According to such a method, it is possible to reduce the distance between the antenna AT and the radio terminal 100A, and the region of the plane wave expands from the distance immediately after the reflection on the mirror surface of the reflecting mirror 7A. Thus, it is possible to expect an effect of reducing the propagation loss. The idealness of the plane wave can be expressed by the phase difference between waves on the same plane. The phase difference that is permissible as the degree of the plane wave is, for example, $\lambda/16$. The phase difference can be evaluated, for example, with a vector network analyzer (VNA).

Test Antenna

Next, the test antenna 6 will be described.

The test antenna 6 transmits or receives a radio signal for measuring the transmission characteristics or the reception characteristics of the DUT 100, to and from the antenna 110 through the reflector 7. The test antenna includes a horizontally polarized antenna 6H and a vertically polarized antenna 6V (see FIG. 2). The reflector 7 has an offset parabolic (see FIG. 6) type structure described later. As illustrated in FIG. 1, the reflector 7 is attached to the required position of the OTA chamber 50 on the side surface 52b by using a reflector holder 58.

The reflector 7 receives a radio wave of a test signal radiated from the test antenna 6 as the primary radiator disposed at the focal position F defined from the rotating paraboloid, on the rotating paraboloid. Then, the reflector reflects the radio wave toward the DUT 100 held by the posture changeable mechanism 56 (during transmission). The reflector 7 receives the radio wave of a measurement target signal radiated from the antenna 110 by the DUT 100 that has received the test signal, on the rotating paraboloid. Then, the reflector reflects the test signal toward the test antenna 6 that has radiated the test signa (during reception). That is, the reflector is configured to reflect the radio wave of the radio signal transmitted and received between the test antenna 6 and the antenna 110 through the rotating paraboloid.

Figure 6:
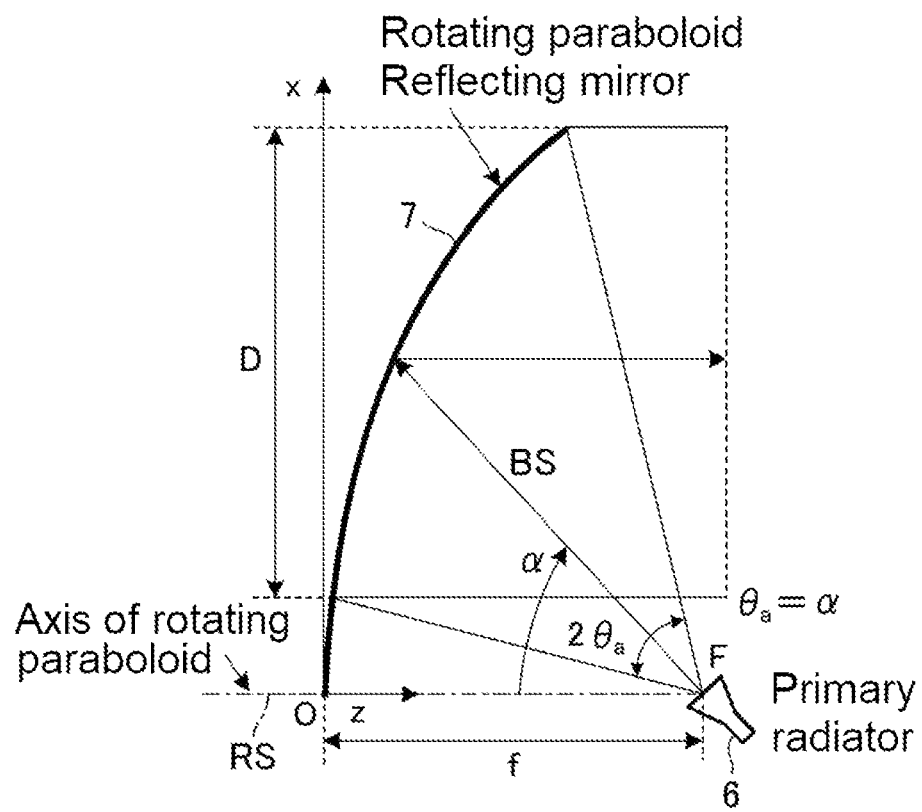
FIG. 6 is a schematic diagram illustrating a structure of a reflection type test antenna used in the temperature test apparatus according to the embodiment of the present invention.

FIG. 6 is a schematic view illustrating the structure of the reflector 7. The reflector 7 is an offset parabolic type and has a mirror surface (shape obtained by cutting out a portion of the rotating paraboloid of a perfect circular parabola) that is asymmetric with respect to the axis of the rotating paraboloid. The test antenna 6 as the primary radiator is located at the focal position F of the offset parabola in an offset state in which a beam axis BS is tilted from an axis RS of the rotating paraboloid, for example, by an angle α (for example, 30°). In other words, the test antenna 6 is disposed to face the reflector 7 at an elevation angle α, and the reception surface of the test antenna 6 is held at an angle perpendicular to the beam axis BS of the radio signal.

With such a configuration, a radio wave (for example, test signal for the DUT 100) radiated from the test antenna 6 is reflected by the rotating paraboloid in a direction parallel to an axial direction of the rotating paraboloid, and a radio wave (for example, measurement target signal transmitted from the DUT 100) incident to the rotating paraboloid in the direction parallel to the axial direction of the rotating paraboloid is reflected by the rotating paraboloid, and thus the radio waves can be guided to the test antenna 6. Compared to the parabolic type, the offset parabola can make the size of the reflector 7 smaller and can be disposed so that the mirror surface becomes close to being a vertical surface. Thus, it is possible to reduce the size of the structure of the OTA chamber 50.

Heat Insulating Housing

Next, the heat insulating housing 70 accommodated in the internal space 51 of the OTA chamber 50 will be described.

Figure 7:
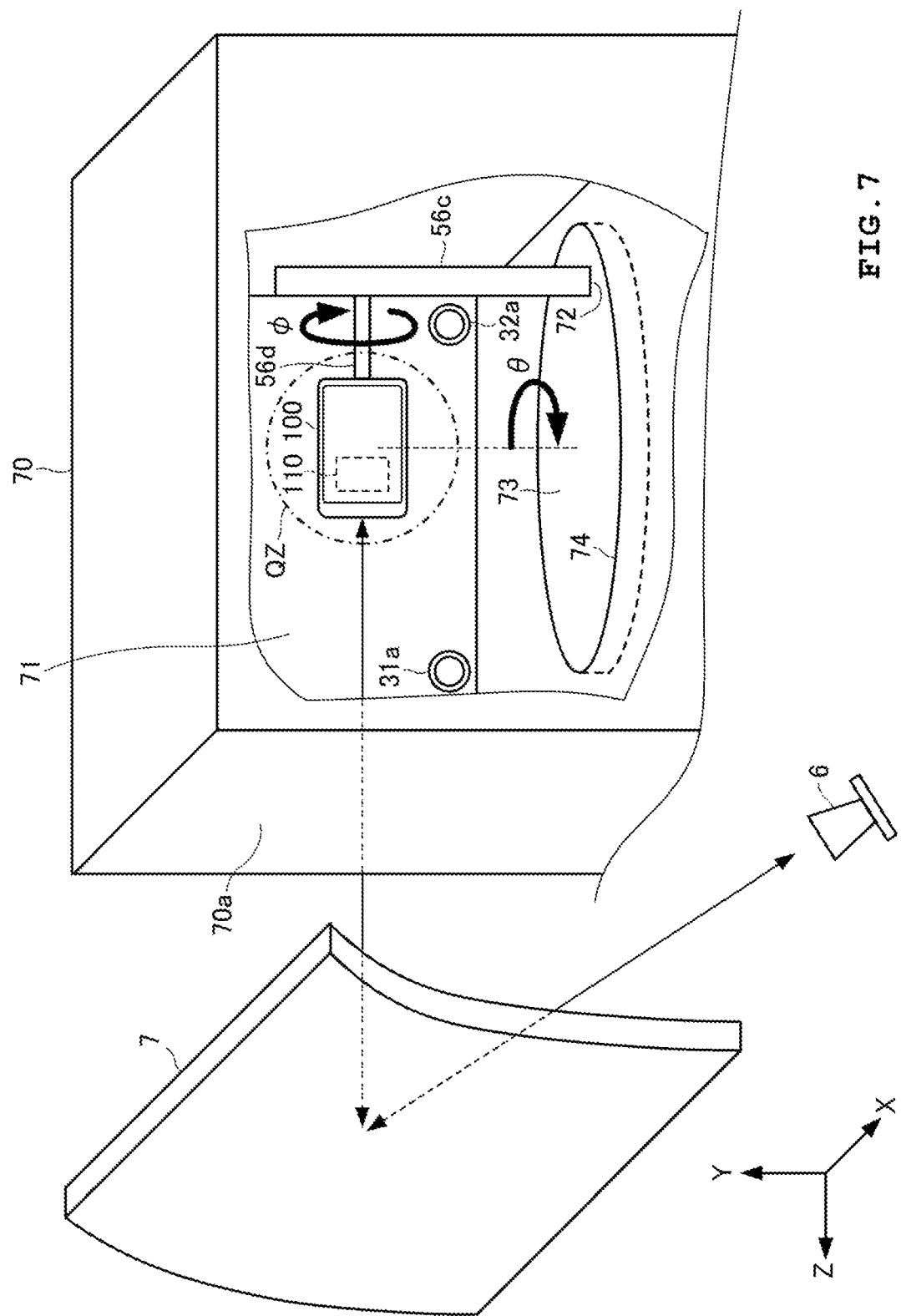
FIG. 7 is a perspective view illustrating a schematic configuration of a heat insulating housing in the temperature test apparatus according to the embodiment of the present invention.

As illustrated in FIGS. 1 and 7, the heat insulating housing 70 is made of a heat insulating material, and surrounds and seals the spatial region 71 including at least the quiet zone QZ. The DUT 100, the DUT mounting portion 56d, and a portion of the fulcrum 56c are accommodated in the spatial region 71. As illustrated in FIG. 7, in the region of the heat insulating housing 70 through which the radio wave of a radio signal transmitted from the test antenna 6 passes before entering into the quiet zone QZ, a flat plate-like portion 70a is formed. The flat plate-like portion has a uniform thickness and is perpendicular to a traveling direction of the radio wave of the radio signal entering into the quiet zone QZ. The flat plate-like portion 70a is provided in the portion of the heat insulating housing 70 through which the radio wave of the test signal that is considered as a plane wave, and is transmitted from the test antenna 6 and then enters into the heat insulating housing 70 passes before entering into the quiet zone QZ.

The heat insulating material forming the heat insulating housing 70 is desirably a material having a dielectric constant close to that of air and having a small dielectric loss. For example, foams such as enlarged polystyrene (EPS), polymethacrylicimide hard foam, or polytetrafluoroethylene (PTFE) can be used.

The heat insulating housing 70 is configured as illustrated in FIGS. 1 and 7 in order to enable rotation of the posture changeable mechanism 56 equipped with the DUT 100 in a state where the heat insulating housing 70 is installed in the internal space 51 of the OTA chamber 50. That is, the heat insulating housing 70 has a through-hole 72 through which a portion of the fulcrum 56c penetrates. The heat insulating housing includes a disk-shaped rotating portion 73 and a hole 74. The rotating portion 73 rotates together with the turntable 56b and the fulcrum 56c. The hole 74 has an inner diameter that is substantially equal to the outer diameter of the rotating portion 73 and accommodates the rotating portion 73 to be slidable and rotatable. For example, it is possible to easily form the rotating portion 73 and the hole 74 having an inner diameter that is substantially equal to the outer diameter of the rotating portion 73, by cutting out a portion of the heat insulating housing made of a heat insulating material in a disk shape.

In the temperature test apparatus 1 in the embodiment, it is important to rotate the posture changeable mechanism 56 equipped with the DUT 100 while keeping the air in the spatial region 71 in the heat insulating housing 70 from leaking to the outside as much as possible. At this time, the friction between the hole 74 and the rotating portion 73 rotating together with the posture changeable mechanism 56 causes a problem that the durability of the heat insulating housing 70 made of the heat insulating material is deteriorated. In order to solve this problem, it is desirable that a friction reduction part is provided on a side wall surface of the rotating portion 73, that faces the hole 74, and on an inner wall surface of the hole 74, that faces the rotating portion 73. The friction reduction part is provided in order to reduce the friction between the side wall surface and the inner wall surface.

Such a friction reduction part is desirably made of a material having a small coefficient of friction and high self-lubricating property. For example, a film or a sheet made of polyacetal (POM), PTFE, ultra high molecular weight polyethylene (UHPE) or the like can be used.

Temperature Control Device

Next, the temperature control device 30 will be described.

Figure 8:
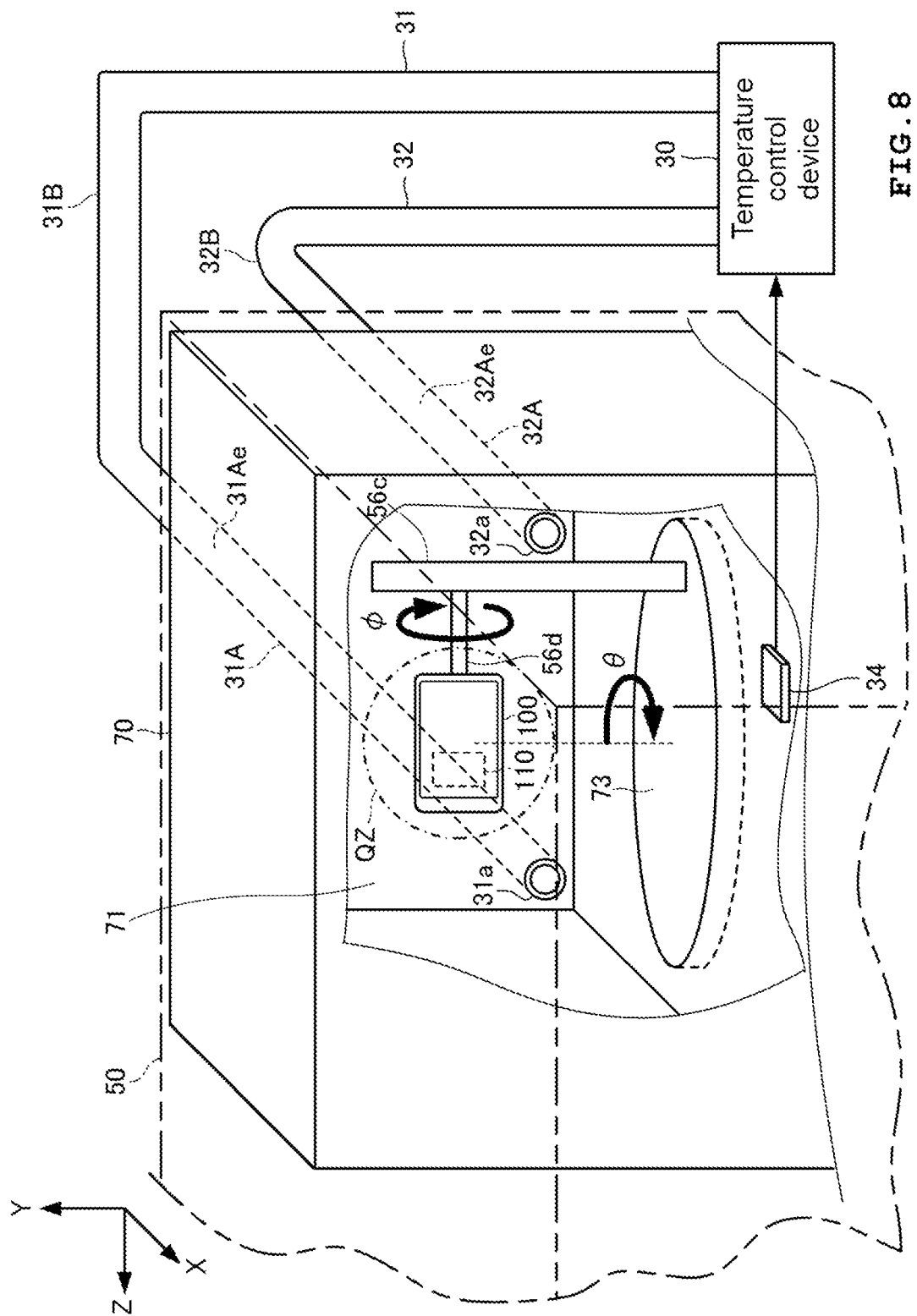
FIG. 8 is a schematic diagram illustrating temperature control in the heat insulating housing by a temperature control device in the temperature test apparatus according to the embodiment of the present invention.

FIG. 8 is a schematic view illustrating the temperature control in the heat insulating housing 70 by the temperature control device 30. The temperature control device 30 is capable of controlling the air temperature in the spatial region 71 of the heat insulating housing 70 to a plurality of predetermined temperatures. Specifically, the temperature control device 30 includes a temperature control gas supply unit (not illustrated) and an exhaust fan. The exhaust fan may be incorporated in the housing of the temperature control device 30, or may be provided outside the housing. A temperature sensor 34 for monitoring the air temperature in the spatial region 71 is provided in the heat insulating housing 70. The temperature sensor 34 is connected to the temperature control device 30.

The temperature control device 30 and the heat insulating housing 70 are connected to each other by pipes 31 and 32. The pipe 31 causes heated or cooled air that is generated by the temperature control gas supply unit of the temperature control device 30 to flow into the heat insulating housing 70 from an opening portion 31a of the pipe 31. The pipe 32 causes the air pushed out from the inside of the heat insulating housing 70 with the inflow of the air from the pipe 32 to be exhausted from an opening portion 32a of the pipe 32 to the outside of the heat insulating housing 70 by the exhaust fan of the temperature control device 30. The temperature control device 30 generates the heated or cooled air so that the temperature instruction value of the temperature sensor 34 is equal to the temperature setting value input by an operation of a user on an operation unit 12 (see FIG. 3). The temperature control device 30 adjusts the temperature in the heat insulating housing 70, for example, by sending air having a temperature adjusted to any temperature in a range of −30° C. to 70° C. to the heat insulating housing 70.

Electromagnetic Shield Structure

Next, an electromagnetic shield structure for preventing leakage of radio waves from the OTA chamber 50 to the outside and intrusion of unnecessary radio waves from the outside into the OTA chamber 50 will be described.

As illustrated in FIG. 8, the heat insulating housing 70 disposed in the OTA chamber 50 and the temperature control device 30 disposed outside the OTA chamber 50 are connected to each other by metal pipes 31A and 32A and flexible pipes 31B and 32B. In the pipes 31A and 32A, a heat insulating material is wound around a space between the heat insulating housing 70 and the OTA chamber 50. In the pipes 31B and 32B, a heat insulating material is wound around a space between the OTA chamber 50 and the temperature control device 30. The pipes 31B and 32B may be made of metal. A gas (temperature control gas) for controlling the temperature of the spatial region 71 in the heat insulating housing 70 passes in the pipes (31A+31B) and 32 (32A+32B). In the embodiment, the temperature control gas is air. In the following description, the type of gas is not limited to the air. Radio waves may leak from the OTA chamber 50 to the outside through the pipes 31 and 32, or unnecessary radio waves may be intruded into the OTA chamber 50 from the outside. Therefore, an electromagnetic shield structure is provided in the pipes 31A and 32A. The electromagnetic shield structure is provided in order to block traveling of radio waves by deforming (for example, dividing, bending, and the like) pipelines 31Ae and 32Ae of the pipes 31A and 32A.

Figure 9A:
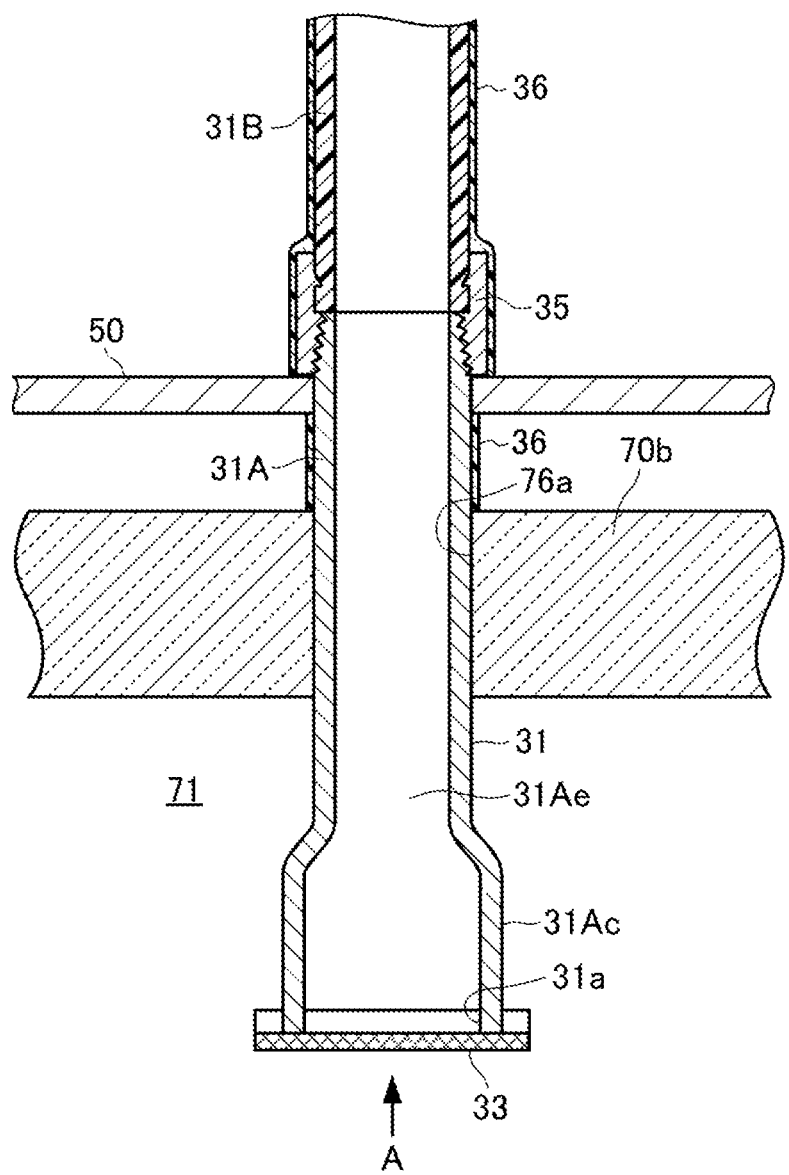
FIGS. 9A and 9B are diagrams illustrating an electromagnetic shield structure of a pipe through which a temperature control gas passes in the temperature test apparatus according to the embodiment of the present invention.
Figure 9B:
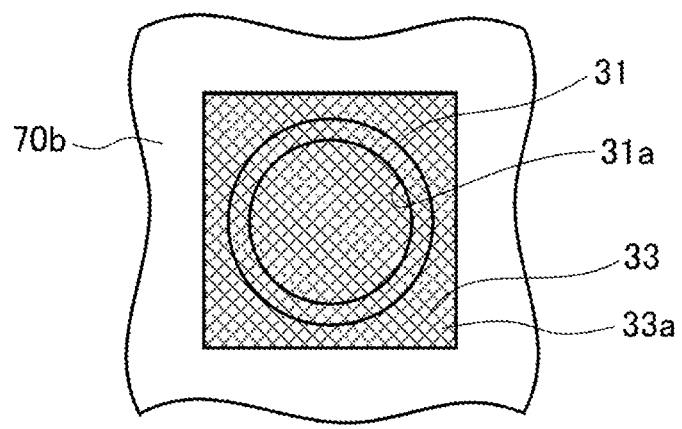

FIGS. 9A and 9B are diagrams illustrating the electromagnetic shield structure of the opening portion 31a of the pipe 31A in which the temperature control gas passes in the temperature test apparatus 1. FIG. 9A is a cross-sectional view of the main portion, and FIG. 9B is a diagram viewed from a direction of an A arrow in FIG. 9A. As illustrated in FIGS. 9A and 9B, the pipe 31A passes through a through-hole 76a formed in the side wall portion 70b of the heat insulating housing 70 and is opened at the opening portion 31a in the spatial region 71. As the electromagnetic shield structure, a metal net portion 33 that blocks the pipeline 31Ae of the pipe 31A is provided in the pipe 31A. Specifically, the net portion 33 is disposed to cover the opening portion 31a at the end portion of the pipe 31A on the heat insulating housing side. The pipe 31A is connected to the pipe 31B by a pipe fitting 35.

Figure 10A:
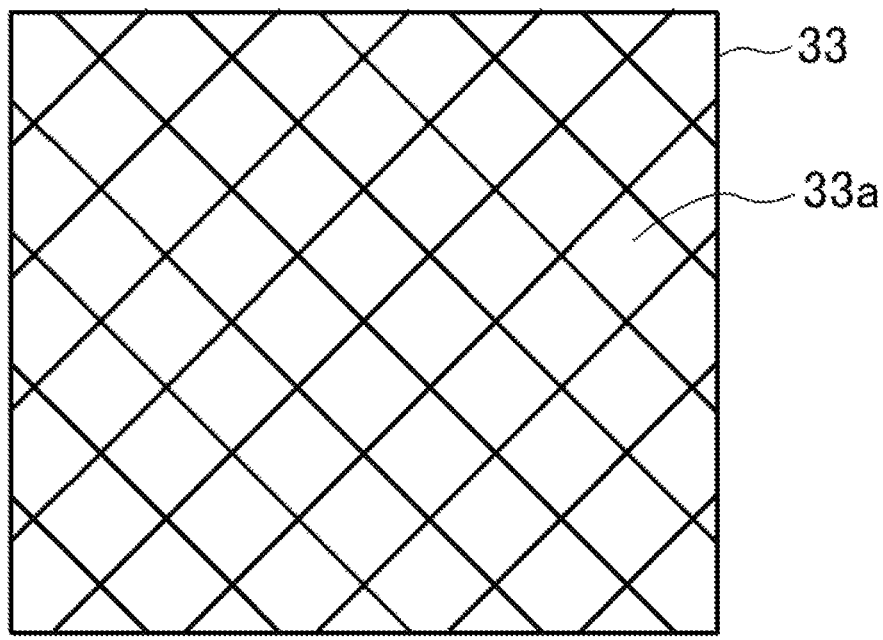
FIGS. 10A and 10B are diagrams illustrating a structure of a net portion used in the electromagnetic shield structure in FIGS. 9A and 9B.
Figure 10B:
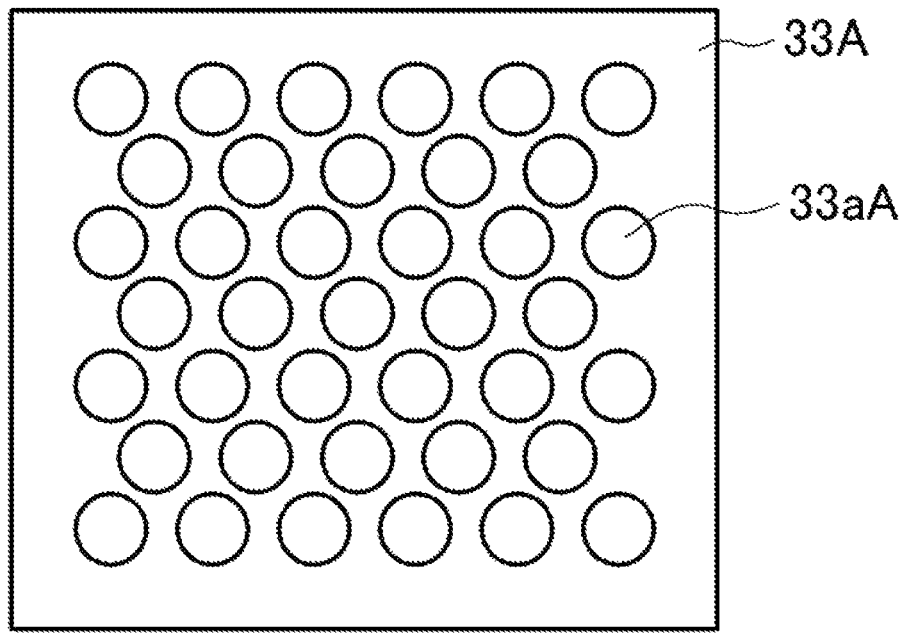

FIG. 10A is a diagram illustrating the structure of the net portion 33 used for the electromagnetic shield in the embodiment. As illustrated in FIG. 10A, the net portion 33 has a structure in which metal strands are formed in a mesh shape. In other words, the pipeline 31Ae of the pipe 31A is divided by multiple meshes 33a, and the temperature control gas can flow through the meshes 33a. As illustrated in FIG. 10B, instead of the metal mesh structure in FIG. 10A, a mesh plate 33A in which multiple through-holes 33aA are formed in a metal plate by cutting or the like can also be used. The temperature control gas can flow through the through-holes 33aA. The shape of the through-hole 33aA is not limited to a circular shape, and may be any shape. The size of the mesh 33a (through-hole 33aA in a case of the mesh plate) is set to a size that allows exhibition of the function of the electromagnetic shield and does not interfere with the flow of the temperature control gas. In the embodiment, when the thickness of the mesh plate as illustrated in FIG. 10B is about 40 mm, the size of one hole is, for example, about 4 mm. As described above, the thickness of the mesh plate and the size of the hole are appropriately selected, and thus the mesh plate and the hole form a waveguide structure, and the frequency can be selected in accordance with the size of the waveguide, so that the function of the shield is improved.

In the embodiment and the scope of claims, the "net portion" includes not only the mesh-like structure illustrated in FIG. 10A but also the mesh plate structure as illustrated in FIG. 10B.

As illustrated in FIG. 9A, the pipe 31A is connected to the through-hole of the metal plate of the OTA chamber 50, and has a diameter-enlarged portion 31Ac at the location in which the metal net portion 33 is provided. In the diameter-enlarged portion, the diameter is enlarged. It is assumed that the "location" means a pipe portion in which the net portion 33 is provided, or a pipe portion immediately before or after the above pipe portion. The pipeline 31Ae is enlarged in the diameter-enlarged portion 31Ac. Thus, the resistance against the gas flowing in the pipe 31A at that portion is reduced. The metal net portion 33 causes the resistance against the flow of gas to increase, but the gas easily flows by the diameter-enlarged portion 31Ac, and it is possible to prevent the decrease of a flow rate of the gas as a whole.

As described above, in the embodiment, the metal net portion 33 is disposed in the heat insulating housing 70 to cover the opening portion 31a of the pipe 31A. With this configuration, the opening portion 31a of the metal pipe 31A is electromagnetically shielded by the metal net portion 33. In addition, it is not possible to cause the radio waves in the OTA chamber 50 to go out through the pipe 31A and to cause external unnecessary radio waves to enter the OTA chamber 50 through the pipe 31A. Therefore, in the temperature test apparatus 1 according to the embodiment, it is possible to prevent leakage of radio waves to the outside from the OTA chamber 50 to the outside through the pipes 31 and 32 and entering of external unnecessary radio waves into the OTA chamber 50 through the pipes 31 and 32, while sending the air for temperature control into the heat insulating housing 70 through the pipe 31 and sending the air from the heat insulating housing 70 through the pipe 32.

In the description with reference to FIG. 9, the electromagnetic shield structure in the pipe 31 for sending the temperature control gas to the heat insulating housing 70 has been described. The similar electromagnetic shield structure is provided in the exhaust pipe 32.

First Modification Example

Next, a first modification example of the electromagnetic shield structure will be described.

Figure 11A:
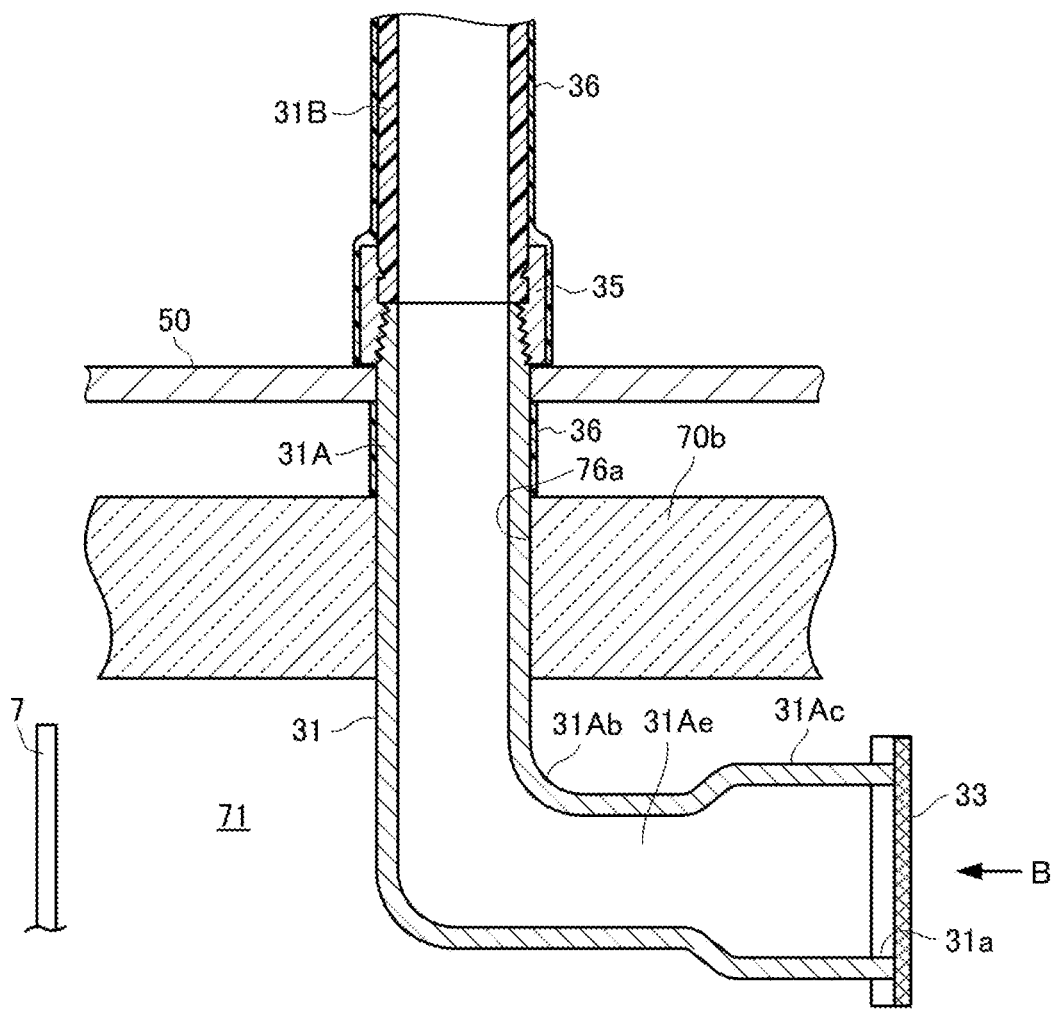
FIGS. 11A and 11B are diagrams illustrating a modification example of the electromagnetic shield structure of the pipe through which the temperature control gas passes in the temperature test apparatus according to the embodiment of the present invention.
Figure 11B:
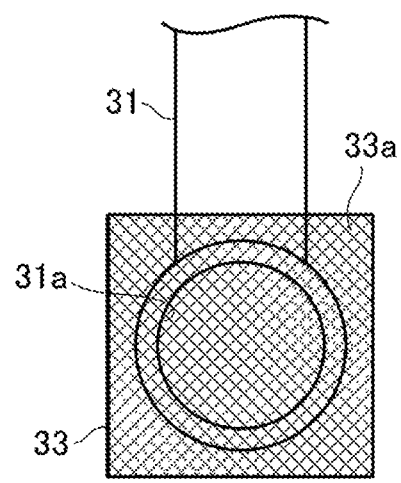

FIGS. 11A and 11B are diagrams illustrating the first modification example of the electromagnetic shield structure of the opening portion 31a of the pipe 31A through which the temperature control gas passes in the temperature test apparatus 1. FIG. 11A is a cross-sectional view of the main portion, and FIG. 11B is a diagram viewed from a direction of a B arrow in FIG. 11A. As illustrated in FIGS. 11A and 11B, the pipe 31A is connected to the through-hole of the metal plate of the OTA chamber 50, passes through the through-hole 76a formed in the side wall portion 70b of the heat insulating housing 70, and then is opened at the opening portion 31a in the spatial region 71. The pipe 31A has a curved portion 31Ab bent at a right angle in the heat insulating housing 70. The opening portion 31a of the pipe 31A is directed by the curved portion 31Ab in a direction opposite to the side where the reflector 7 is provided. Thus, the radio waves that has been radiated from the test antenna 6 and then is reflected by the reflector 7 do not directly enter the opening portion 31a of the pipe 31A. Accordingly, the radio waves are less likely to leak from the OTA chamber 50 to the outside.

In the embodiment, the direction in which the opening portion 31a is directed by the curved portion 31Ab of the pipe 31A is the direction opposite to the side where the reflector 7 is provided. The direction is not limited to this, and the opening portion may be directed in any direction in consideration of a gas flow and the like in the heat insulating housing 70. The angle at which the pipeline 31Ae of the pipe 31A is bent by the curved portion 31Ab of the pipe 31A is not limited to 90°. The angle can be set to any angle in consideration of the gas flow in the heat insulating housing 70, the wavelength of the radio wave, and the like.

Also, in the first modification example, the metal net portion 33 is disposed in the heat insulating housing 70 to cover the opening portion 31a of the pipe 31A. The pipe 31A has a diameter-enlarged portion 31Ac having an enlarged diameter, at the location adjacent to the metal net portion 33.

As described above, in the first modification example, the pipe 31A has a curved portion 31Ab bent inside the heat insulating housing 70. With this configuration, traveling of a radio wave that has strong straightness and a short wavelength is blocked at the curved portion 31Ab, and the radio wave is less likely to leak to the outside. Therefore, in the temperature test apparatus 1 according to the first modification example, it is possible to prevent leakage of radio waves to the outside from the OTA chamber 50 to the outside through the pipes 31A and 32A and entering of external unnecessary radio waves into the OTA chamber 50 through the pipes 31A and 32A, while sending the air for temperature control into the heat insulating housing 70 through the pipe 31A and sending the air from the heat insulating housing 70 through the pipe 32A.

In the first modification example, the curved portion 31Ab of the pipe 31A is provided in the heat insulating housing 70, but the curved portion 31Ab is not limited to this. The curved portion 31Ab may be provided outside the heat insulating housing 70 or the OTA chamber 50.

Second Modification Example

Next, a second modification example of the electromagnetic shield structure will be described.

Figure 12:
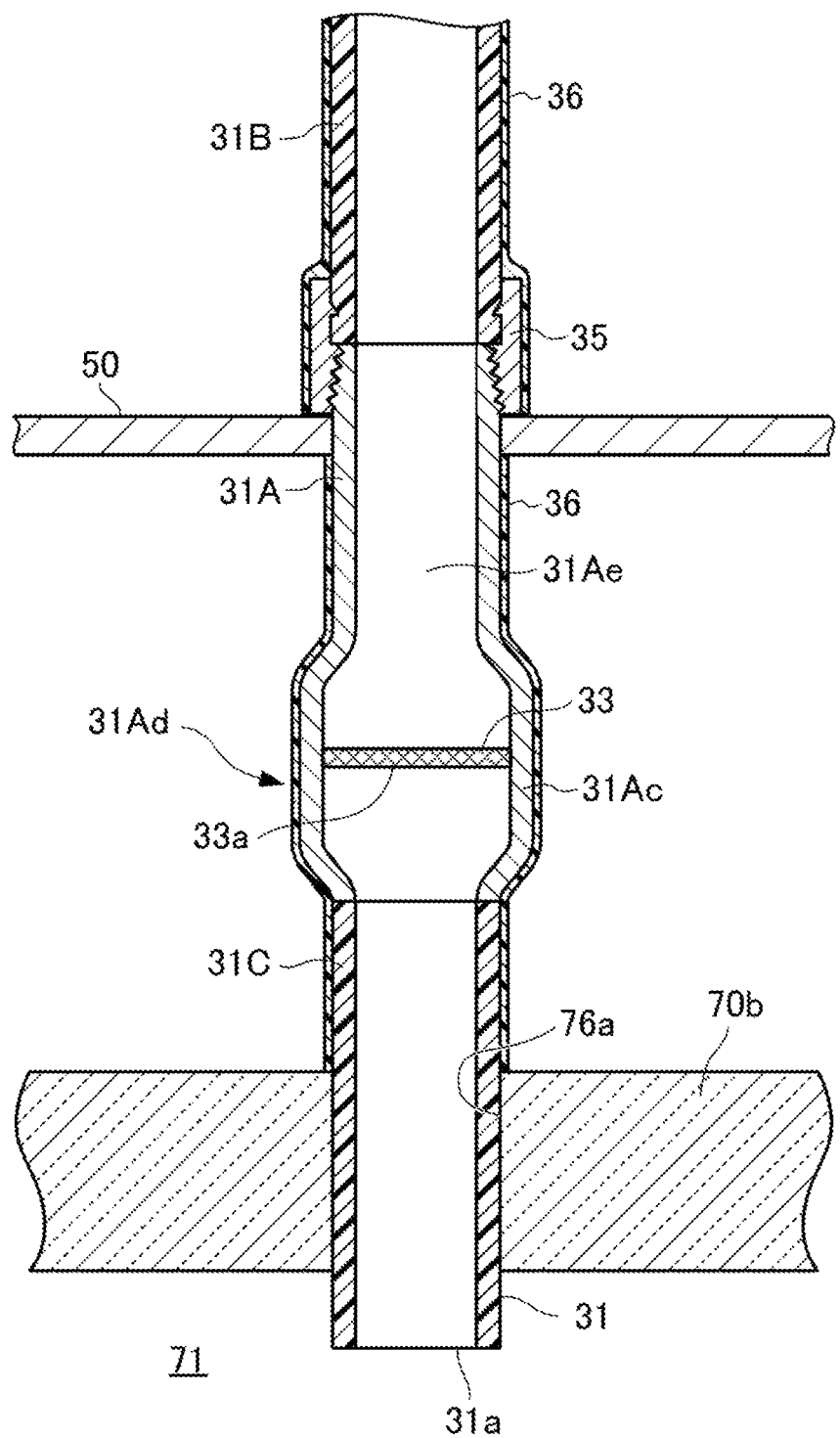
FIG. 12 is a diagram illustrating another modification example of the electromagnetic shield structure of the pipe through which the temperature control gas passes in the temperature test apparatus according to the embodiment of the present invention.

FIG. 12 is a cross-sectional view of a main portion illustrating a second modification example of the structure for electromagnetic shielding in the pipe 31A through which the temperature control gas passes in the temperature test apparatus 1. As illustrated in FIG. 12, the pipe 31A is connected to the through-hole of the metal plate of the OTA chamber 50. The metal net portion 33 for electromagnetic shielding is provided in the pipe at an intermediate portion 31Ad of the pipe 31A. The pipe 31A has a diameter-enlarged portion 31Ac having an enlarged diameter, at the location in which the metal net portion is provided. The pipe 31A passes through a through-hole 76a formed in the side wall portion 70b of the heat insulating housing 70 and is opened at the opening portion 31a in the spatial region 71. The pipe 31A may be connected to a flexible pipe 31C around which the heat insulating material 36 is wound and that penetrates into the heat insulating housing 70. The pipe 31C may be made of metal.

As described above, in the second modification example, the metal net portion 33 for electromagnetic shielding is provided in the pipe at the intermediate portion 31Ad of the pipe 31A. With this configuration, electromagnetic shielding is performed by the metal net portion 33 provided at the intermediate portion 31Ad of the metal pipe 31A. Thus, it is not possible to cause the radio waves in the OTA chamber 50 to go out through the pipe 31A and to cause external unnecessary radio waves to enter the OTA chamber 50 through the pipe 31A. It is not necessary to have an electromagnetic shield structure in the heat insulating housing 70, and thus it is possible to realize space saving. Therefore, in the temperature test apparatus 1 according to the second modification example, it is possible to prevent leakage of radio waves to the outside from the OTA chamber 50 to the outside through the pipes 31A and 32A and entering of external unnecessary radio waves into the OTA chamber 50 through the pipes 31A and 32A, while sending the air for temperature control into the heat insulating housing 70 through the pipe 31A and sending the air from the heat insulating housing 70 through the pipe 32A.

Third Modification Example

Next, a third modification example of the electromagnetic shield structure will be described.

Figure 13:
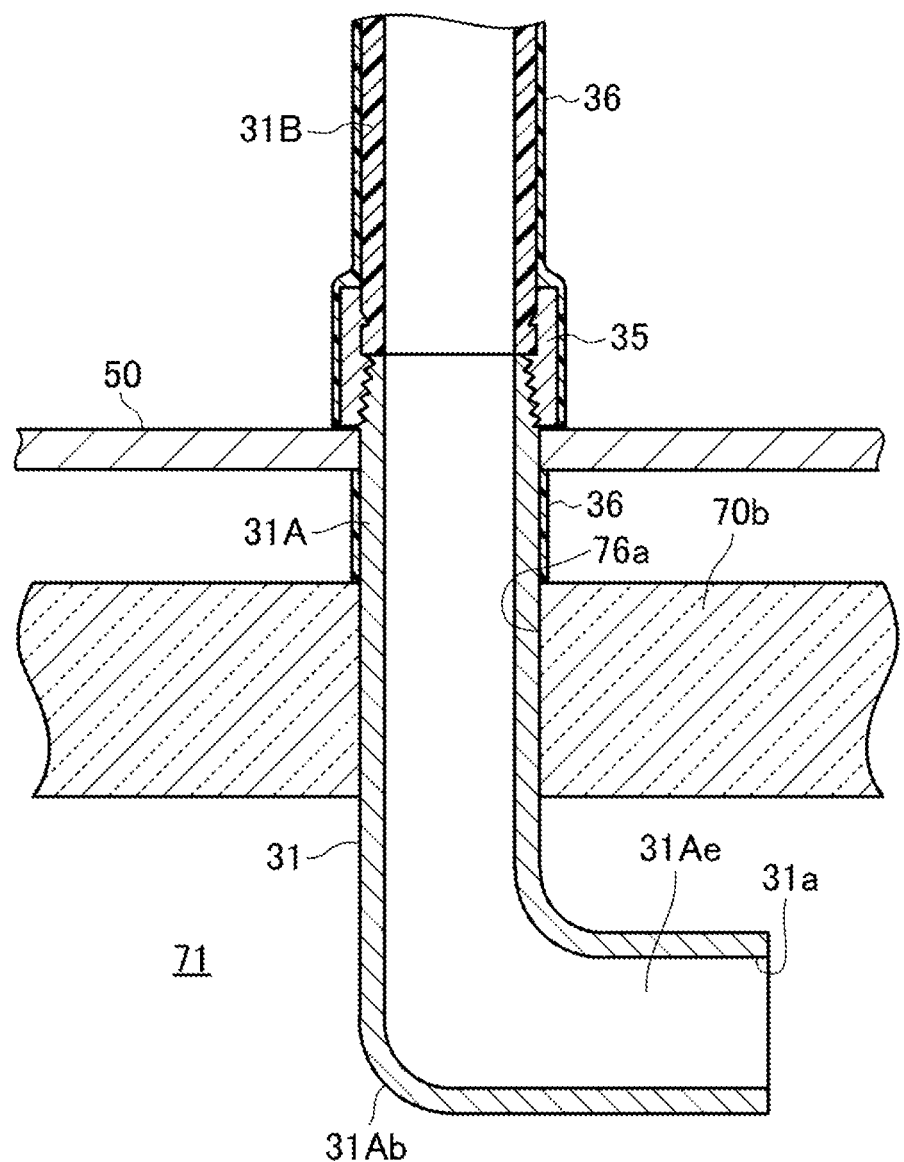
FIG. 13 is a diagram illustrating still another modification example of the electromagnetic shield structure of the pipe through which the temperature control gas passes in the temperature test apparatus according to the embodiment of the present invention.

FIG. 13 is a cross-sectional view illustrating a third modification example of the electromagnetic shield structure of the pipe 31A through which the temperature control gas passes in the temperature test apparatus 1. As illustrated in FIG. 13, the pipe 31A in the third modification example is different from that in the first modification example in that the pipe 31A does not include a metal net portion and a diameter-enlarged portion. The components similar to those in the first modification example are denoted by the same reference numerals, and detailed description thereof will be appropriately omitted.

In the third modification example, the flexible pipe 31B is connected to the metal pipe 31A through the through-hole of the metal plate in the OTA chamber 50. The pipe 31A passes through a through-hole 76a formed in the side wall portion 70b of the heat insulating housing 70 and is opened at the opening portion 31a in the spatial region 71. The pipe 31A has a curved portion 31Ab bent at a right angle in the heat insulating housing 70. The angle at which the pipeline 31Ae of the pipe 31A is bent by the curved portion 31Ab of the pipe 31A is not limited to 90°. The angle can be set to any angle in consideration of the gas flow in the heat insulating housing 70, the wavelength of the radio wave, and the like.

As described above, in the third modification example, the pipe 31A has the curved portion 31Ab bent in the heat insulating housing 70. Thus, traveling of a radio wave that has strong straightness and a short wavelength is blocked at the curved portion 31Ab, and the radio wave is less likely to leak to the outside. Therefore, in the temperature test apparatus 1 according to the third modification example, it is possible to prevent leakage of radio waves to the outside from the OTA chamber 50 to the outside through the pipes 31A and 32A and entering of external unnecessary radio waves into the OTA chamber 50 through the pipes 31A and 32A, while sending the air for temperature control into the heat insulating housing 70 through the pipe 31A and sending the air from the heat insulating housing 70 through the pipe 32A.

Figure 14:
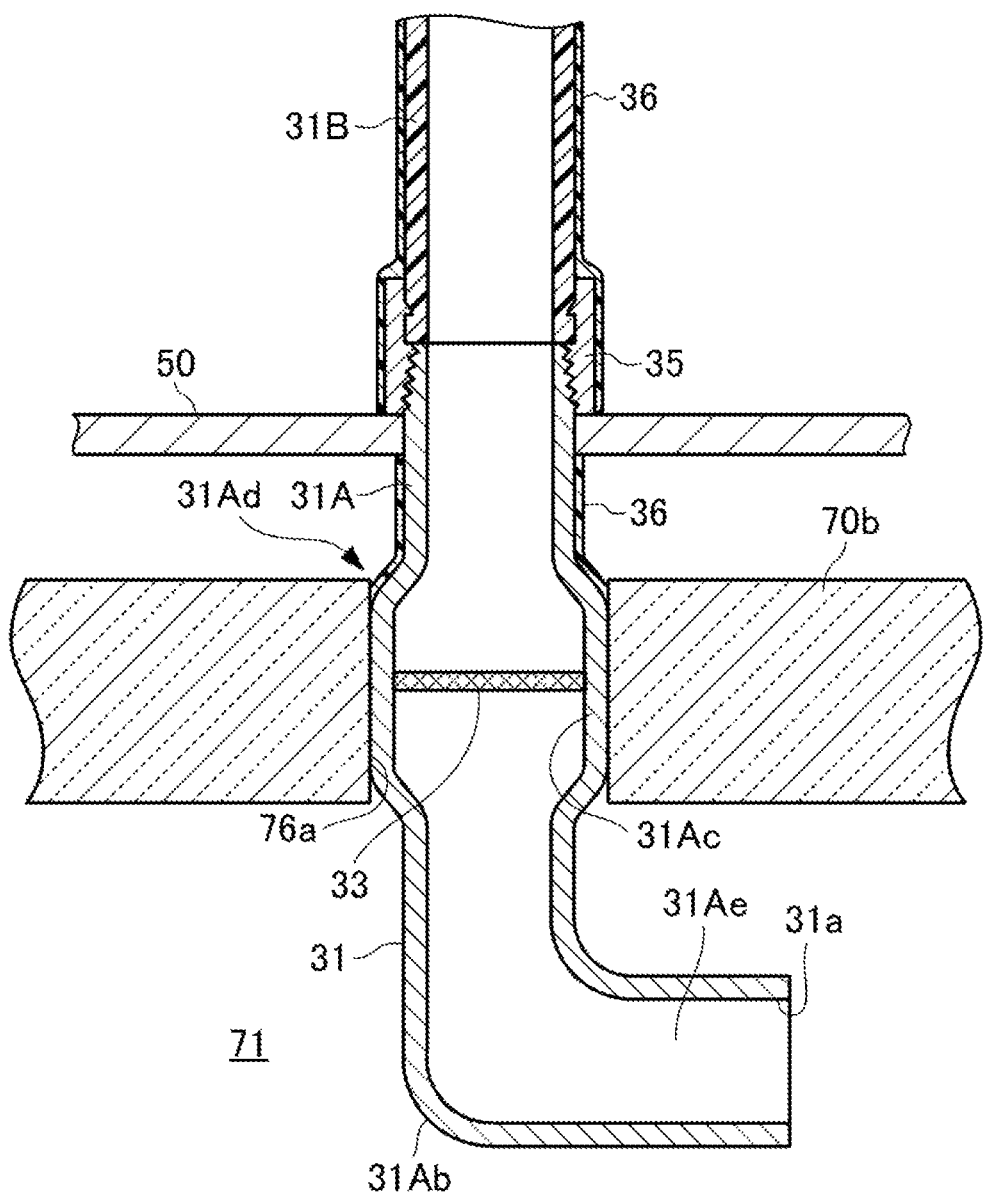
FIG. 14 is a diagram illustrating yet another modification example of the electromagnetic shield structure of the pipe through which the temperature control gas passes in the temperature test apparatus according to the embodiment of the present invention.

FIG. 14 is a cross-sectional view illustrating a fourth modification example of the electromagnetic shield structure of the pipe 31A through which the temperature control gas passes in the temperature test apparatus 1. In the fourth modification example, the pipe 31B is connected to the metal pipe 31A through the through-hole of the metal plate in the OTA chamber 50. The pipe 31A passes through a through-hole 76a formed in the side wall portion 70b of the heat insulating housing 70 and is opened at the opening portion 31a in the spatial region 71. The metal net portion 33 for electromagnetic shielding is provided in the pipe at the intermediate portion 31Ad of the pipe 31A. The pipe 31A has a diameter-enlarged portion 31Ac having an enlarged diameter, at the location in which the metal net portion 33 is provided. Further, the pipe 31A has a curved portion 31Ab bent at a right angle in the heat insulating housing 70. The angle at which the pipeline 31Ae of the pipe 31A is bent by the curved portion 31Ab of the pipe 31A is not limited to 90°. The angle can be set to any angle in consideration of the gas flow in the heat insulating housing 70, the wavelength of the radio wave, and the like. The pipe 31A has the through-hole 76a, and the metal net portion 33 for electromagnetic shielding is provided in the pipe.

Next, the integrated control device 10 and the NR system simulator 20 of the temperature test apparatus 1 according to the embodiment will be described with reference to FIGS. 2 to 4.

Integrated Control Device

The integrated control device 10 measures the transmission characteristics or the reception characteristics of the DUT 100 each time the posture of the DUT 100 is changed by the posture changeable mechanism 56 in a state where the temperature of the spatial region 71 is controlled by the temperature control device 30. As described below, the integrated control device 10 collectively controls the NR system simulator 20, the posture changeable mechanism 56, and the temperature control device 30. Therefore, the integrated control device 10 is communicably connected to the NR system simulator 20, the posture changeable mechanism 56, and the temperature control device 30 via a network 19 such as Ethernet (registered trademark), for example.

Figure 3:
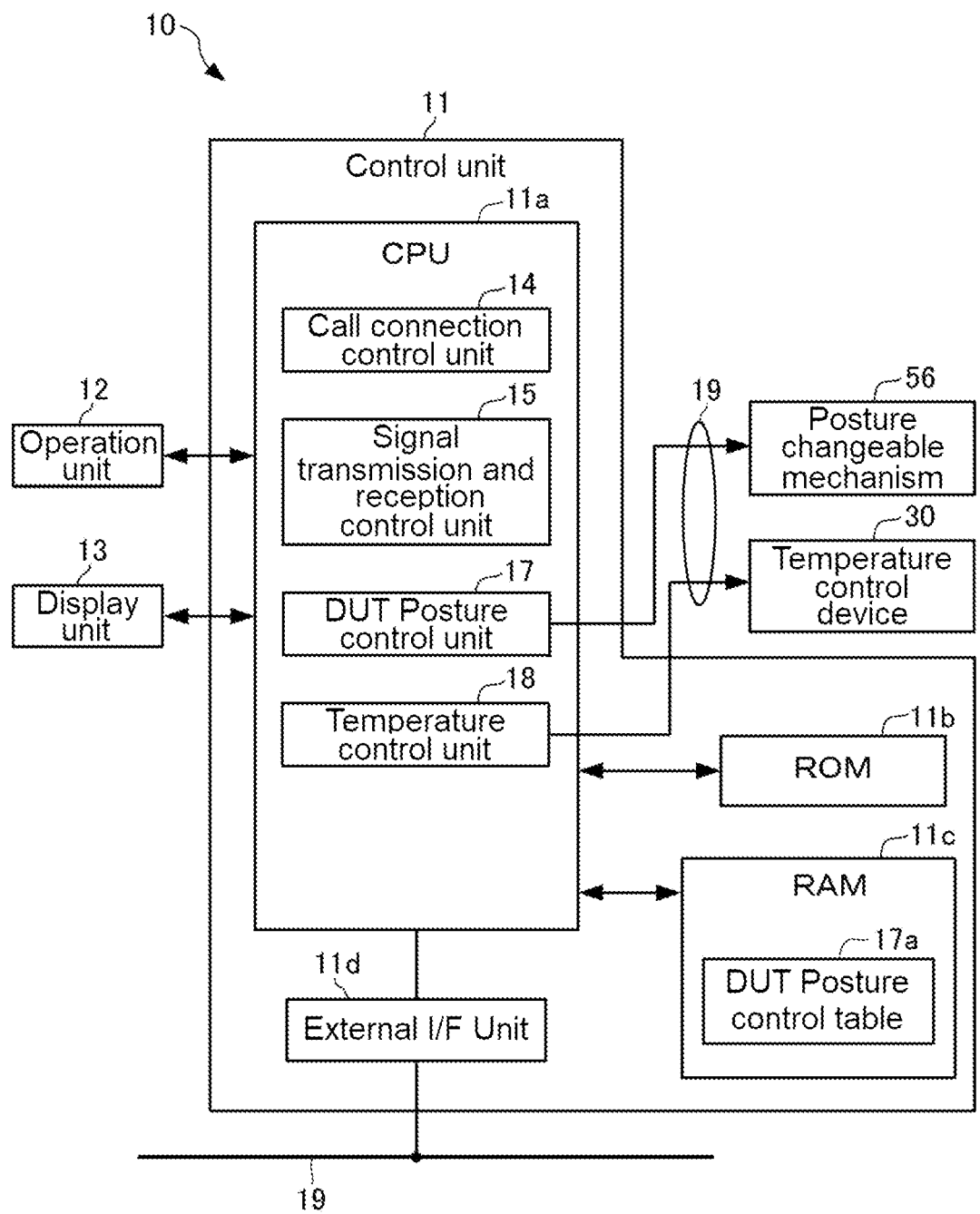
FIG. 3 is a block diagram illustrating a functional configuration of an integrated control device in the temperature test apparatus according to the embodiment of the present invention.

FIG. 3 is a block diagram illustrating a functional configuration of the integrated control device 10. As illustrated in FIG. 3, the integrated control device 10 includes a control unit 11, the operation unit 12, and a display unit 13. The control unit 11 is configured by, for example, a computer device. The computer device includes, for example, a central processing unit (CPU) 11a, a read only memory (ROM) 11b, a random access memory (RAM) 11c, an external interface (I/F) unit 11d, a non-volatile storage medium such as a hard disk device (not illustrated), and various input/output ports, as illustrated in FIG. 3.

The CPU 11a performs predetermined information processing for realizing the function of the temperature test apparatus 1 and comprehensive control for the NR system simulator 20. The ROM 11b stores an operating system (OS) for starting up the CPU 11a, other programs, control parameters, and the like. The RAM 11c stores execution codes, data, and the like of the OS and applications used in an operation of the CPU 11a. The external interface (I/F) unit 11d has an input interface function of receiving an input of a predetermined signal and an output interface function of outputting a predetermined signal.

The external I/F unit 11d is communicably connected to the NR system simulator 20 via the network 19. The external I/F unit 11d is also connected to the temperature control device 30 for the OTA chamber 50 and the posture changeable mechanism 56 via the network 19. The operation unit 12 and the display unit 13 are connected to the input/output port. The operation unit 12 is a functional unit for inputting various types of information such as commands. The display unit 13 is a functional unit of displaying various types of information such as an input screen for the various types of information and measurement results.

The above-described computer device functions as the control unit 11 when the CPU 11a executes a program stored in the ROM 11b with the RAM 11c as a work area. As illustrated in FIG. 3, the control unit 11 includes a call connection control unit 14, a signal transmission and reception control unit 15, a DUT posture control unit 17, and a temperature control unit 18. The call connection control unit 14, the signal transmission and reception control unit 15, the DUT posture control unit 17, and the temperature control unit 18 are also realized by the CPU 11a executing a predetermined program stored in the ROM 11b in the work area of the RAM 11c.

The call connection control unit 14 drives the test antenna 6 to transmit and receive a control signal (radio signal) to and from the DUT 100, and thus perform control of establishing a call (in a state where transmission and reception of a radio signal is possible) between the NR system simulator 20 and the DUT 100.

The signal transmission and reception control unit 15 monitors a user operation in the operation unit 12. When the user performs a predetermined measurement start operation related to the measurement of the transmission characteristics and the reception characteristics of the DUT 100, the signal transmission and reception control unit transmits a signal transmission command to the NR system simulator 20 through the temperature control in the temperature control unit 18 and the call connection control in the call connection control unit 14. The signal transmission and reception control unit 15 controls the NR system simulator 20 to transmit a test signal via the test antenna 6, and also controls the NR system simulator 20 to transmit a signal reception command and to receive a measurement target signal via the test antenna 6.

The DUT posture control unit 17 controls the posture of the DUT 100 held by the posture changeable mechanism 56, during the measurement. In order to realize such control, for example, a DUT posture control table 17a is stored in advance in the ROM 11b. The DUT posture control table 17a stores the number of drive pulses (number of operation pulses) for determining the rotational drive of a stepping motor, as control data, when the stepping motor is adopted as the drive unit 56a.

The DUT posture control unit 17 deploys the DUT posture control table 17a in the work area of the RAM 11c, and controls driving of the posture changeable mechanism 56 based on the DUT posture control table 17a so that the antenna 110 is sequentially directed in all three-dimensional directions, and the posture of the DUT 100 changes, as described above.

The temperature control unit 18 monitors the user operation in the operation unit 12, and transmits a temperature control command to the temperature control device 30 when the measurement start operation is performed by the user.

NR System Simulator

Figure 4:
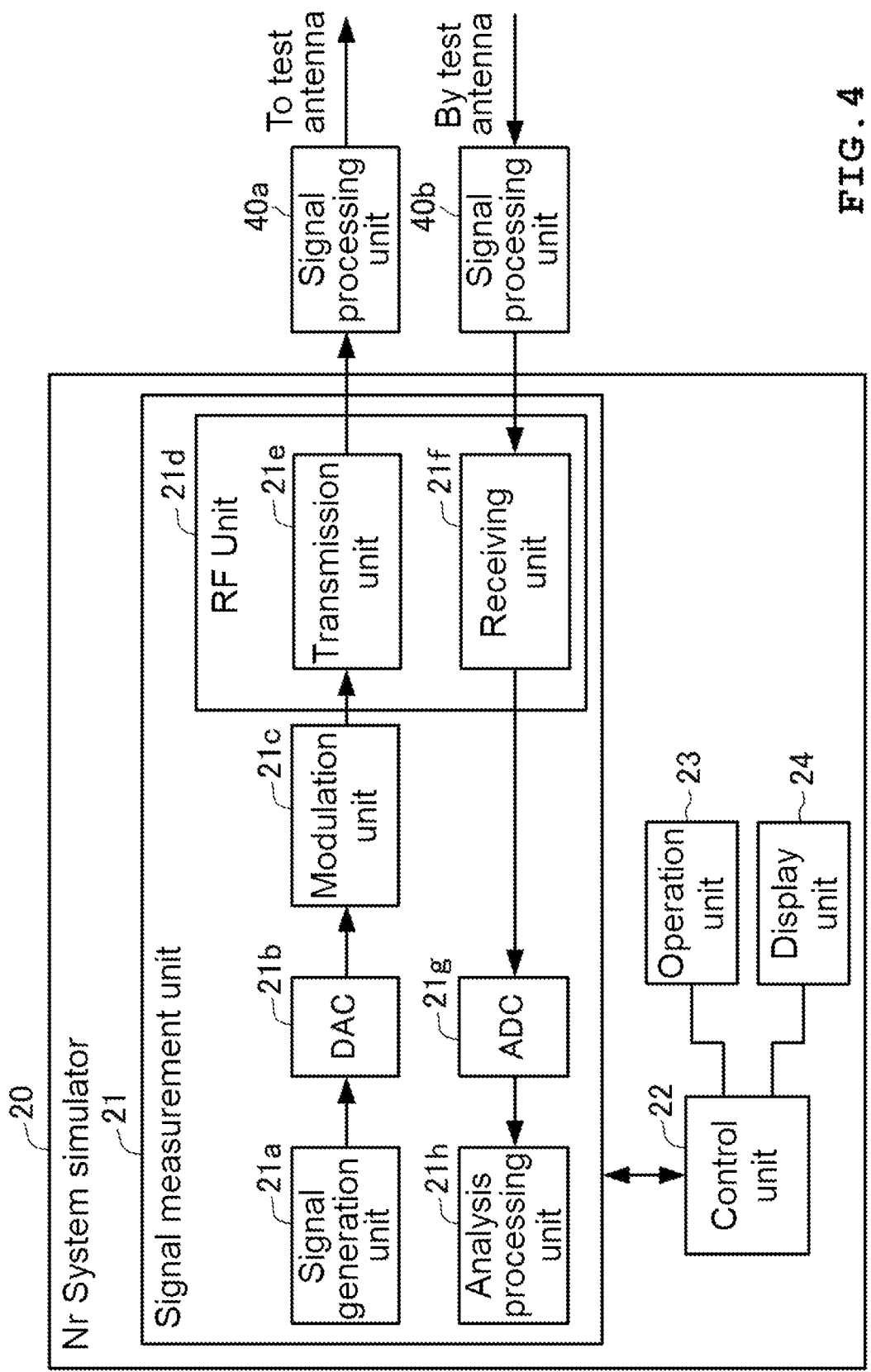
FIG. 4 is a block diagram illustrating a functional configuration of an NR system simulator in the temperature test apparatus according to the embodiment of the present invention.

As illustrated in FIG. 4, the NR system simulator 20 in the temperature test apparatus 1 according to the embodiment includes a signal measurement unit 21, a control unit 22, an operation unit 23, and a display unit 24. The signal measurement unit 21 includes a signal generation function unit and a signal analysis functional unit. The signal generation function unit includes a signal generation unit 21a, a digital-to-analog converter (DAC) 21b, a modulation unit 21c, a transmission unit 21e of an RF unit 21d. The signal analysis functional unit includes a receiving unit 21f of the RF unit 21d, an analog-to-digital converter (ADC) 21g, and an analysis processing unit 21h.

In the signal generation function unit of the signal measurement unit 21, the signal generation unit 21a generates waveform data having a reference waveform, specifically, for example, an I component baseband signal and a Q component baseband signal being an orthogonal component signal of the I component baseband signal. The DAC 21b converts waveform data (I component baseband signal and Q component baseband signal) having a reference waveform output from the signal generation unit 21a, from a digital signal into an analog signal. The DAC outputs the resultant of the conversion to the modulation unit 21c. The modulation unit 21c performs modulation processing of mixing a local signal with each of the I component baseband signal and the Q component baseband signal, combining both signals, and outputting a digital modulation signal. The RF unit 21d generates a test signal corresponding to the frequency of each communication standard, from the digital modulation signal output from the modulation unit 21c. The RF unit outputs the generated test signal to the DUT 100 by the transmission unit 21e through the signal processing unit 40a and the test antenna 6.

In the signal analysis functional unit of the signal measurement unit 21, the receiving unit 21f receives the measurement target signal transmitted from the DUT 100 that has received the test signal with the antenna 110, through the signal processing unit 40b. Then, the RF unit 21d converts the measurement target signal into a signal (IF signal) in an intermediate frequency band by mixing the measurement target signal with the local signal. The ADC 21g converts the measurement target signal converted into the IF signal by the receiving unit 21f of the RF unit 21d, from the analog signal into a digital signal. Then, the ADC outputs the digital signal into the analysis processing unit 21h.

The analysis processing unit 21h generates waveform data corresponding to each of the I component baseband signal and the Q component baseband signal by performing digital processing on the measurement target signal being the digital signal output by the ADC 21g. Then, the analysis processing unit performs processing of analyzing the I component baseband signal and the Q component baseband signal based on the waveform data. In the measurement of the transmission characteristics of the DUT 100, the analysis processing unit 21h can, for example, measure equivalent isotropically radiation power (EIRP), total radiated power (TRP), spurious radiation, modulation accuracy (EVM), transmission power, constellation, spectrum, and the like. In the measurement of the reception characteristics of the DUT 100, the analysis processing unit 21h can measure, for example, reception sensitivity, a bit error rate (BER), a packet error rate (PER), and the like. Here, EIRP indicates the radio signal intensity in the main beam direction of the antenna under test. Further, TRP indicates the total value of the electric power radiated into the space from the antenna under test.

The control unit 22 is configured by, for example, a computer device including a CPU, a RAM, a ROM, and various input/output interfaces, similar to the control unit 11 of the integrated control device 10 described above. The CPU performs predetermined information processing and control for realizing each function of the signal generation function unit, the signal analysis functional unit, the operation unit 23, and the display unit 24.

The operation unit 23 and the display unit 24 are connected to the input/output interface of the computer device. The operation unit 23 is a functional unit for inputting various types of information such as commands. The display unit 24 is a functional unit of displaying various types of information such as an input screen for the various types of information and measurement results.

In the embodiment, the integrated control device 10 and the NR system simulator 20 are separate devices, but may be configured as one device. In this case, the control unit 11 of the integrated control device 10 and the control unit 22 of the NR system simulator 20 may be integrated and realized by one computer device.

Signal Processing Unit

Next, the signal processing units 40a and 40b will be described.

The signal processing unit 40a is provided between the transmission unit 21e and the test antenna 6, and is configured by an up-converter, an amplifier, a frequency filter, and the like. The signal processing unit 40a performs processing of frequency conversion (up-conversion), amplification, and frequency selection on the test signal output to the test antenna 6.

The signal processing unit 40b is provided between the receiving unit 21f and the test antenna 6, and is configured by a down-converter, an amplifier, a frequency filter, and the like. The signal processing unit 40b performs processing of frequency conversion (down-conversion), amplification, and frequency selection on the measurement target signal input from the test antenna 6.

Temperature Test Method

Figure 15:
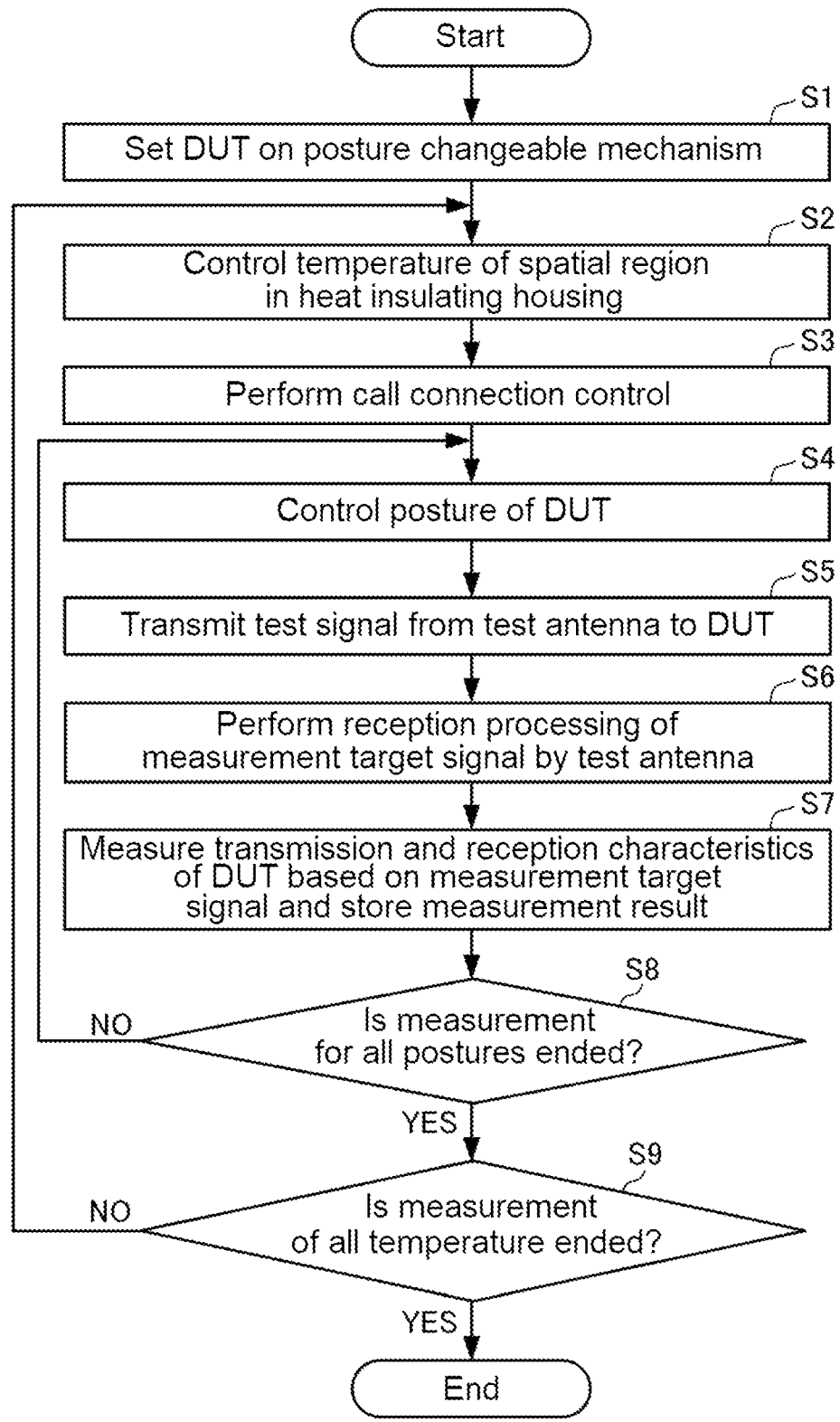
FIG. 15 is a flowchart illustrating an outline of a temperature test method performed using the temperature test apparatus according to the embodiment of the present invention.

Next, a temperature test method for measuring the temperature dependency of the transmission characteristics and the reception characteristics of the DUT 100 by using the temperature test apparatus 1 according to the embodiment will be described with reference to the flowchart of FIG. 15.

Firstly, the user sets a DUT 100 to be tested on the DUT mounting portion 56d of the posture changeable mechanism 56 provided in the internal space 51 of the OTA chamber 50 (Step S1).

Then, the user uses the operation unit 12 of the integrated control device 10 to perform a measurement start operation for instructing the control unit 11 to start measurement of the transmission characteristics and the reception characteristics of the DUT 100. The measurement start operation may be performed by the operation unit 23 of the NR system simulator 20.

After the setting work of the DUT 100 is performed, the control unit 11 of the integrated control device 10 monitors whether or not the measurement start operation for the transmission characteristics and the reception characteristics of the DUT 100 is performed by the operation unit 12.

When it is determined that the measurement start operation has not been performed, the control unit 11 continues monitoring. When the control unit 11 determines that the measurement start operation has been performed, the temperature control unit 18 transmits a temperature control command to the temperature control device 30. The temperature control device 30 performs, based on the temperature control command, control of adjusting the temperature of air in the spatial region 71 to any of a plurality of predetermined temperatures respectively corresponding to a plurality of temperature setting values input by the user operating the operation unit 12 in advance (temperature control step S2).

Then, the call connection control unit 14 of the control unit 11 performs call connection control by using the test antenna 6 to transmit and receive a control signal (radio signal) to and from the DUT 100 (Step S3). Specifically, the NR system simulator 20 transmits a control signal (call connection request signal) having a predetermined frequency to the DUT 100 via the test antenna 6 by radio. The DUT 100 that has received the call connection request signal transmits, as a response, a control signal (call connection response signal) after setting the frequency for which the connection is requested. The NR system simulator 20 receives the call connection response signal and confirms that the response has been received normally. A series of the processing refers to the call connection control. With the call connection control, a state in which a radio signal having a predetermined frequency can be transmitted and received between the NR system simulator 20 and the DUT 100 via the test antenna 6 is established.

Processing in which the DUT 100 receives the radio signal transmitted from the NR system simulator 20 via the test antenna 6 and the reflector 7 is referred as downlink (DL) processing. On the contrary, processing in which the DUT 100 transmits the radio signal to the NR system simulator 20 via the reflector 7 and the test antenna 6 is referred to as uplink (UL) processing. The test antenna 6 is used to perform the processing of establishing a link (call) and the processing of downlink (DL) and uplink (UL) after the link is established, and also functions as the link antenna.

After establishing the call connection in Step S3, the DUT posture control unit 17 of the integrated control device 10 controls the posture of the DUT 100 disposed in the quiet zone QZ to a predetermined posture by the posture changeable mechanism 56 (Step S4).

After the posture of the DUT 100 is controlled and set to a predetermined posture by the posture changeable mechanism 56, the signal transmission and reception control unit 15 of the integrated control device 10 transmits a signal transmission command to the NR system simulator 20. The NR system simulator 20 transmits a test signal to the DUT 100 via the test antenna 6 based on the signal transmission command (Step S5).

The transmission of the test signal by the NR system simulator 20 is performed as follows. In the NR system simulator 20 (see FIG. 4), the signal generation unit 21a generates a signal for generating a test signal under the control of the control unit 22 that has received the signal transmission command. Then, the DAC 21b performs digital-to-analog conversion processing on the signal generated by the signal generation unit. The modulation unit 21c performs modulation processing on the analog signal obtained by the digital-to-analog conversion. The RF unit 21d generates the test signal corresponding to the frequency of each communication standard, from the modulated signal. The transmission unit 21e transmits the test signal (DL data) to the signal processing unit 40a.

The signal processing unit 40a performs signal processing such as frequency conversion (up-conversion), amplification, and frequency selection on the test signal, and transmits the signal after the processing to the test antenna 6. Such a signal is output to the DUT 100 via the reflector 7 by the test antenna 6.

The signal transmission and reception control unit 15 performs control during a period after the control of test signal transmission is started in Step S5 until the measurement of the transmission characteristics and the reception characteristics of the DUT 100 is ended, so that the test signal is transmitted at an appropriate timing.

The DUT 100 receives the test signal (DL data) transmitted via the test antenna 6 and the reflector 7 by the antenna 110 in a state of different postures that are sequentially changed based on the posture control in Step S4. In addition, the DUT 100 transmits the measurement target signal being a response signal to the test signal.

After the transmission of the test signal is started in Step S5, reception processing is subsequently performed under the control of the signal transmission and reception control unit 15 (Step S6). In the reception processing, the test antenna 6 receives the measurement target signal transmitted from the DUT 100 that has received the test signal and outputs the received signal to the signal processing unit 40b. The signal processing unit 40b performs signal processing such as frequency conversion (down-conversion), amplification, and frequency selection on the measurement target signal, and outputs the signal to the NR system simulator 20.

The NR system simulator 20 performs measurement processing of measuring the measurement target signal subjected to frequency conversion by the signal processing unit 40b (Step S7).

Specifically, the receiving unit 21f of the RF unit 21d in the NR system simulator 20 receives an input of the measurement target signal subjected to signal processing by the signal processing unit 40b. Under the control of the control unit 22, the RF unit 21d converts the measurement target signal input to the receiving unit 21f into an IF signal having a lower frequency. Then, the ADC 21g converts the IF signal from an analog signal to a digital signal and outputs the digital signal to the analysis processing unit 21h, under the control of the control unit 22. The analysis processing unit 21h generates waveform data corresponding to each of the I component baseband signal and the Q component baseband signal. The analysis processing unit 21h analyzes the measurement target signal based on the above-described generated waveform data under the control of the control unit 22.

More specifically, in the NR system simulator 20, the analysis processing unit 21h measures the transmission characteristics and the reception characteristics of the DUT 100 based on the analysis result of the measurement target signal under the control of the control unit 22.

For example, for the transmission characteristics of the DUT 100, processing as follows is performed. Firstly, the NR system simulator 20 transmits a request frame for transmitting an uplink signal as a test signal under the control of the control unit 22. The DUT 100 transmits the uplink signal frame as the measurement target signal to the NR system simulator 20 in response to the request frame for transmitting the uplink signal. The analysis processing unit 21h performs processing of evaluating the transmission characteristics of the DUT 100 based on the uplink signal frame.

For the reception characteristics of the DUT 100, processing as follows is performed, for example. Under the control of the control unit 22, the analysis processing unit 21h calculates the number of transmissions of the measurement frame transmitted from the NR system simulator 20 as the test signal, and a ratio of the number of receptions of ACK and NACK transmitted from the DUT 100 as the measurement target signal with respect to the measurement frame, as an error rate (PER).

In Step S7, under the control of the control unit 22, the analysis processing unit 21h stores the results of measuring the transmission characteristics and the reception characteristics of the DUT 100 in a storage area (not illustrated) of the RAM or the like, as the transmission characteristics and the reception characteristics at the temperature controlled in Step S2.

Then, the control unit 11 of the integrated control device 10 determines whether or not the measurement of the transmission characteristics and the reception characteristics of the DUT 100 has been ended for all desired postures (Step S8). Here, when it is determined that the measurement has not been ended (NO in Step S8), the process returns to Step S4 and continues the processing.

When it is determined that the measurement has been completed for all the postures (YES in Step S8), the control unit 11 determines whether or not the measurement of the transmission characteristics and the reception characteristics of the DUT 100 has been ended for all temperatures set in advance by the user (Step S9).

When it is determined that the measurement has not been ended for all the temperatures (NO in Step S9), the control unit 11 returns to Step S2 and continues the processing. When it is determined that the measurement has been completed for all the temperatures (YES in Step S9), the control unit 11 ends the test.

As described above, in the temperature test apparatus 1 according to the embodiment, the temperature control device 30 and the heat insulating housing 70 are connected to each other by metal pipes 31A and 32A and flexible pipes 31B and 32B. In the pipes 31A and 32A, the heat insulating material 36 is wound around a space between the heat insulating housing 70 and the OTA chamber 50. In the pipes 31B and 32B, the heat insulating material 36 is wound around a space between the OTA chamber 50 and the temperature control device 30. The gas (temperature control gas) for controlling the temperature of the spatial region 71 in the heat insulating housing 70 passes in the pipes 31 (31A+31B) and 32 (32A+32B). The metal net portion 33 that blocks the pipelines 31Ae and 32Ae of the pipes 31A and 32A is provided in the pipes 31A and 32A. With this configuration, the pipelines 31Ae and 32Ae of the metal pipes 31A and 32A are electromagnetically shielded by the metal net portion 33. In addition, it is not possible to cause the radio waves in the OTA chamber 50 to go out through the pipes 31A and 32A and to cause external unnecessary radio waves to enter into the OTA chamber 50 through the pipes 31A and 32A. Therefore, in the temperature test apparatus 1 according to the embodiment, it is possible to prevent leakage of radio waves to the outside from the OTA chamber 50 to the outside through the pipes 31 and 32 and entering of external unnecessary radio waves into the OTA chamber 50 through the pipes 31 and 32, while sending the air for temperature control into the heat insulating housing 70 through the pipe 31 and sending the air from the heat insulating housing 70 through the pipe 32.

In addition, in the temperature test apparatus 1 according to the embodiment, the pipes 31A and 32A have a diameter-enlarged portion 31Ac in which the diameter has been enlarged, at the location in which the metal net portion 33 is provided, or immediately before or after the location. With this configuration, in the temperature test apparatus 1 according to the embodiment, the resistance against the flow of air for temperature control is increased by the metal net portion 33, but the air for temperature control easily flows by the diameter-enlarged portion 31Ac, and it is possible to prevent the decrease of the flow rate of the air for temperature control as a whole.

The present invention can be applied not only to an anechoic box but also to an anechoic chamber. In the above embodiment, the OTA chamber 50 is a chamber adopting the CATR method, but the present invention is not limited to this. The OTA chamber 50 may be a chamber adopting the direct far field method illustrated in FIG. 5A.

As described above, the present invention has an effect that, in the temperature test apparatus in which only the inside of a heat insulating box installed in the anechoic box is temperature-controlled with high efficiency by using a temperature control device installed on the outside of a relatively large anechoic box for the OTA test, that enables measurement of the temperature dependency of the transmission characteristics or reception characteristics of the device under test, it is possible to prevent the leakage of a radio wave from the anechoic box and the intrusion of an unnecessary radio wave from the outside into the anechoic box. Thus, the present invention is useful in general for the temperature test apparatus and the temperature test method for radio terminals.

DESCRIPTION OF REFERENCE NUMERALS AND SIGNS

1 Temperature test apparatus
2 Measurement device
5, 8 Link antenna
6 Test antenna
7 Reflector
7A Reflecting mirror
10 Integrated control device
11, 22 Control unit
11a CPU
11b ROM
11c RAM
11d External interface unit
12, 23 Operation unit
13, 24 Display unit
14 Call connection control unit
15 Signal transmission and reception control unit
17 DUT posture control unit
17a DUT posture control table
18 Temperature control unit
19 Network
20 NR system simulator
21 Signal measurement unit
21a Signal generation unit
21b DAC
21c Modulation unit
21d RF unit
21e Transmission unit
21f Receiving unit
21g ADC
21h Analysis processing unit
30 Temperature control device
31, 32 Pipe
31A, 32A Metal pipe
31B, 31C, 32B Flexible pipe
31a, 32a Opening portion
31Ab Curved portion
31Ac Diameter-enlarged portion
31Ad Intermediate portion
31Ae, 32Ae Pipeline
33 Net portion
33a Mesh
34 Temperature sensor
35 Pipe fitting
36 Heat insulating material
40a, 40b Signal processing unit
50 OTA chamber (anechoic box)
51 Internal space
52 Housing body
52a Bottom surface
52b Side surface
52c Top surface
53 Wall portion
53a Through-hole
55 Radio wave absorber
56 Posture changeable mechanism
56a Drive unit
56b Turntable
56c fulcrum
56d DUT mounting portion
57, 59 Holder
58 Reflector holder
70 Heat insulating housing
70a Flat plate-like portion
70b Side wall portion
71 Spatial region
72 Through-hole
73 Rotating portion
73a Side wall surface
74 Hole
76a Through-hole
90 Rack structure body
90a Rack
100 DUT (device under test)
100A Radio terminal
110 Antenna (antenna under test)
F Focal position of reflector
QZ Quiet Zone

What is claimed is:

1. A temperature test apparatus that measures temperature dependency of transmission characteristics or reception characteristics of a device under test including an antenna under test, the apparatus comprising:
an anechoic box that has an internal space that is not influenced by a surrounding radio wave environment and is formed by a metal housing;
a test antenna that is accommodated in the internal space and is configured to transmit or receive a radio signal to and from the antenna under test;
a heat insulating housing that is accommodated in the internal space and is made of a heat insulating material to surround a spatial region including a quiet zone in which the device under test is disposed;
a temperature control device that is disposed outside the anechoic box and controls a temperature of the spatial region;
a pipe through which a gas for controlling the temperature of the spatial region passes and that connects the temperature control device and the heat insulating housing to each other through the metal housing of the anechoic box; and
a measurement device that uses the test antenna in a state where the temperature of the spatial region is controlled by the temperature control device, to measure the transmission characteristics or the reception characteristics of the device under test,
wherein a portion of the pipe from the metal housing to a predetermined position of the internal space is made of metal, and the portion of the pipe further comprises an electromagnetic shield structure.

2. The temperature test apparatus according to claim 1, wherein the electromagnetic shield structure is a metal net portion inserted into a pipeline of the portion of the pipe.

3. The temperature test apparatus according to claim 2, wherein the net portion is disposed to cover an opening portion at an end portion of the portion of the pipe on the heat insulating housing side.

4. The temperature test apparatus according to claim 2, wherein the net portion is disposed at an intermediate portion of the pipeline of the portion of the pipe.

5. The temperature test apparatus according to claim 3, wherein a curved portion obtained by bending the pipeline of the portion of the pipe is provided at the portion of the pipe.

6. The temperature test apparatus according to claim 4, wherein a curved portion obtained by bending the pipeline of the portion of the pipe is provided at the portion of the pipe.

7. The temperature test apparatus according to claim 2, wherein a diameter-enlarged portion in which a diameter at a location in which the net portion is provided is enlarged is provided at the portion of the pipe.

8. The temperature test apparatus according to claim 1, wherein the electromagnetic shield structure is a curved portion obtained by bending a pipeline of the portion of the pipe.

* * * * *